US012218062B2

(12) United States Patent
Kim et al.

(10) Patent No.: US 12,218,062 B2
(45) Date of Patent: *Feb. 4, 2025

(54) METHOD OF FABRICATING A SEMICONDUCTOR MEMORY DEVICE INCLUDING AN EXTENSION GATE CUTTING REGION

(71) Applicant: SAMSUNG ELECTRONICS CO., LTD., Suwon-si (KR)

(72) Inventors: Jun Hyoung Kim, Seoul (KR); Young-Jin Kwon, Suwon-si (KR); Geun Won Lim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/514,716

(22) Filed: Nov. 20, 2023

(65) Prior Publication Data

US 2024/0088045 A1   Mar. 14, 2024

Related U.S. Application Data

(63) Continuation of application No. 17/018,400, filed on Sep. 11, 2020, now Pat. No. 11,862,566.

(30) Foreign Application Priority Data

Jan. 8, 2020  (KR) .................. 10-2020-0002422

(51) Int. Cl.
*H01L 23/535* (2006.01)
*H01L 21/768* (2006.01)
(Continued)

(52) U.S. Cl.
CPC ...... *H01L 23/535* (2013.01); *H01L 21/76805* (2013.01); *H01L 21/76895* (2013.01); *H10B 43/27* (2023.02); *H10B 43/40* (2023.02)

(58) Field of Classification Search
CPC ............ H01L 23/535; H01L 21/76805; H01L 21/76895; H10B 43/10; H10B 43/27; H10B 43/40; H10B 43/50
See application file for complete search history.

(56) References Cited

U.S. PATENT DOCUMENTS 9,806,093 B2 * 10/2017 Toyama ................ H10B 43/35
10,381,371 B2   8/2019 Ogawa et al.
(Continued)

FOREIGN PATENT DOCUMENTS

| KR | 10-2019-0085475 A | 7/2019 |
| KR | 10-2019-0091109 A | 8/2019 |
| KR | 10-2019-0140774 | 12/2019 |

OTHER PUBLICATIONS

Office Action in Korean Appln. No. 10-2020-0002422, mailed on Mar. 6, 2024, 23 pages (with machine English translation).
(Continued)

*Primary Examiner* — Khiem D Nguyen
(74) *Attorney, Agent, or Firm* — Fish & Richardson P.C.

(57) ABSTRACT

A semiconductor device, in which a cell array region and an extension region are arranged along a first direction, and in which contact regions and through regions are alternately arranged along the first direction in the extension region, including: a mold structure including a plurality of first insulating patterns and a plurality of gate electrodes, which are alternately stacked on a first substrate; a channel structure penetrating the mold structure in the cell array region to intersect the plurality of gate electrodes; respective gate contacts that are on the mold structure in the contact regions and are connected to each of the gate electrodes; and a plurality of second insulating patterns, the second insulating patterns being stacked alternately with the first insulating patterns in the mold structure in the through regions, the
(Continued)

plurality of second insulating patterns including a different material from the plurality of first insulating patterns.

13 Claims, 31 Drawing Sheets

(51) Int. Cl.
*H10B 43/27* (2023.01)
*H10B 43/40* (2023.01)

(56) References Cited

U.S. PATENT DOCUMENTS

| | | | |
|---|---|---|---|
| 11,862,566 B2* | 1/2024 | Kim | H10B 43/40 |
| 2013/0078791 A1* | 3/2013 | Xie | H01L 21/32135 |
| | | | 438/585 |
| 2016/0071876 A1 | 3/2016 | Mizuno et al. | |
| 2017/0250194 A1* | 8/2017 | Lee | H10B 43/40 |
| 2017/0358593 A1* | 12/2017 | Yu | H10B 43/27 |
| 2018/0226424 A1* | 8/2018 | Shin | H10B 43/50 |
| 2018/0358370 A1 | 12/2018 | Hwang et al. | |
| 2019/0051599 A1 | 2/2019 | Zhang et al. | |
| 2019/0085270 A1 | 3/2019 | Yarita et al. | |
| 2019/0139979 A1 | 5/2019 | Kanamori et al. | |
| 2019/0172838 A1 | 6/2019 | Jo et al. | |
| 2019/0214404 A1* | 7/2019 | Ahn | H01L 29/40117 |
| 2019/0237475 A1 | 8/2019 | Jung et al. | |
| 2020/0027893 A1 | 1/2020 | Yang et al. | |
| 2020/0251479 A1 | 8/2020 | Sakakibara et al. | |

OTHER PUBLICATIONS

Notice of Allowance in Korean Appln. No. 10-2020-0002422, mailed on Nov. 12, 2024, 6 pages (with Machine translation).

* cited by examiner

METHOD OF FABRICATING A SEMICONDUCTOR MEMORY DEVICE INCLUDING AN EXTENSION GATE CUTTING REGION

CROSS-REFERENCE TO RELATED APPLICATION

This application is a continuation of U.S. patent application Ser. No. 17/018,400, dated Sep. 11, 2020, issued as U.S. Pat. No. 11,862,566, which claims priority to Korean Patent Application No. 10-2020-0002422, filed on Jan. 8, 2020, in the Korean Intellectual Property Office, and entitled: "Semiconductor Memory Device and Method of Fabricating the Same," is incorporated by reference herein in its entirety.

BACKGROUND

1. Field

Embodiments relate to a semiconductor device and a method of fabricating the same.

2. Description of the Related Art

The integration density of semiconductor devices has been increased to meet customer expectation such as excellent performance and low price. For semiconductor devices, integration density is a factor in determining the price of the products. Thus, the increase of integration density is sought after.

The integration density of two-dimensional (2D) or planar semiconductor devices is considerably affected by a level of fine pattern forming technology. However, since highly expensive equipment is generally needed to form fine patterns, there are limitations to increasing the integration density of 2D semiconductor devices, and thus development has advanced on three-dimensional (3D) semiconductor devices.

SUMMARY

Embodiments are directed to a semiconductor device in which a cell array region and an extension region are arranged along a first direction, and in which contact regions and through regions are alternately arranged along the first direction in the extension region, the semiconductor device including: a mold structure including a plurality of first insulating patterns and a plurality of gate electrodes, which are alternately stacked on a first substrate; a channel structure penetrating the mold structure in the cell array region to intersect the plurality of gate electrodes; respective gate contacts that are on the mold structure in the contact regions and are connected to each of the gate electrodes; and a plurality of second insulating patterns, the plurality of second insulating patterns being stacked alternately with the plurality of first insulating patterns in the mold structure in the through regions, the plurality of second insulating patterns including a different material from the plurality of first insulating patterns.

Embodiments are also directed to a semiconductor device in which a cell array region and an extension region are arranged along a first direction, and in which contact regions and through regions are alternately arranged along the first direction in the extension region, the semiconductor device including: a mold structure including a plurality of gate electrodes, which are stacked on a substrate to be spaced apart from one another; a channel structure that penetrates the mold structure in the cell array region to intersect the plurality of gate electrodes; an extension gate cutting region that extends in the first direction to cut the plurality of gate electrodes in the mold structure in the contact regions; and a plurality of insulating patterns, stacked on same levels as the plurality of gate electrodes, in the mold structure in the through regions, each of the insulating patterns including a first side that extends along the first direction and a second side that forms arcs that are centered around ends of the extension gate cutting region.

Embodiments are also directed to a semiconductor device in which a cell array region and an extension region are arranged along a first direction, and in which contact regions and through regions are alternately arranged along the first direction in the extension region, the semiconductor device including: a mold structure including a ground selection line on a substrate, and a plurality of wordlines stacked on the ground selection line; a channel structure that intersects the ground selection line and the plurality of wordlines through the mold structure in the cell array region; an extension gate cutting region that extends in the first direction to cut the ground selection line and the plurality of wordlines in the mold structure in the contact regions; and a plurality of insulating patterns, stacked on same levels as the plurality of wordlines, in the mold structure in the through regions, the ground selection line partially overlapping with the plurality of insulating patterns in a direction that is perpendicular to a top surface of the substrate.

Embodiments are also directed to a method of fabricating a semiconductor device, the method including: providing a substrate including a cell array region and an extension region, which are arranged along a first direction, the extension region including contact regions and through regions, which are alternately arranged along the first direction; forming a mold structure including first insulating patterns and second insulating patterns, which are alternately stacked on the substrate; forming a channel structure through the mold structure in a cell array region of the substrate to intersect the first insulating patterns and the second insulating patterns; forming an extension gate cutting region extending in the first direction to cut the mold structure, in the mold structure of the contact regions; and selectively removing the second insulating patterns in the contact regions, using the extension gate cutting region, so that the second insulating patterns in the through regions remain.

BRIEF DESCRIPTION OF THE DRAWINGS

Features will become apparent to those of skill in the art by describing in detail example embodiments with reference to the attached drawings in which.

DETAILED DESCRIPTION

Figure 1:
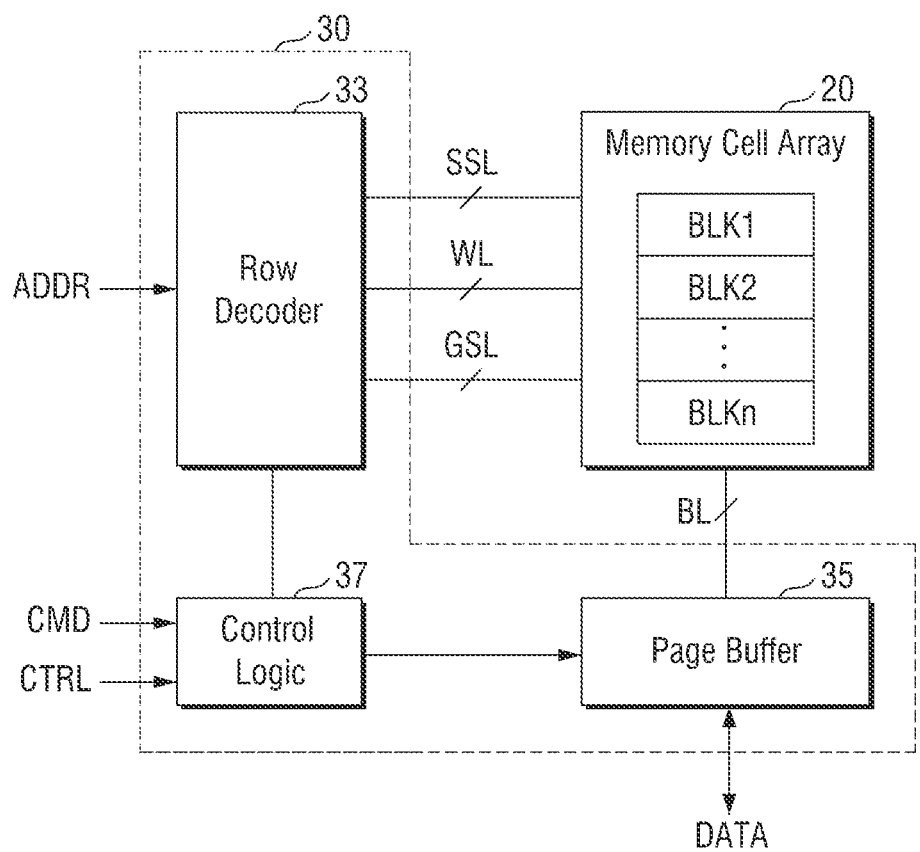
FIG. 1 is a block diagram of a semiconductor memory device according to an example embodiment.

FIG. 1 is a block diagram of a semiconductor memory device according to an example embodiment.

Referring to FIG. 1, a semiconductor memory device 10 may include a memory cell array 20 and a peripheral circuit 30.

The memory cell array 20 may include a plurality of memory cell blocks BLK1 through BLKn. Each of the memory cell blocks BLK1 through BLKn may include a plurality of memory cells. The memory cell blocks BLK1 through BLKn may be connected to the peripheral circuit 30 via bitlines BL, wordlines WL, at least one string selection line SSL, and at least one ground selection line GSL.

The memory cell blocks BLK1 through BLKn may be connected to a row decoder 33 via the wordlines WL, the string selection line SSL, and the ground selection line GSL. The memory cell blocks BLK1 through BLKn may also be connected to a page buffer 35 via the bitlines BL.

The peripheral circuit 30 may receive an address ADDR, commands CMD, and control signals CTRL from outside the semiconductor memory device 10, and may exchange data DATA with an external device outside the semiconductor memory device 10. The peripheral circuit 30 may include a control logic 37, the row decoder 33, and the page buffer 35. The peripheral circuit 30 may further include various sub-circuits such as an input/output circuit, a voltage generating circuit for generating various voltages needed for an operation of the semiconductor memory device 10, and an error correction circuit for correcting error in data DATA read from the memory cell array 20.

The control logic 37 may be connected to the row decoder 33, the input/output circuit, and the voltage generating circuit. The control logic 37 may control a general operation of the semiconductor memory device 10. The control logic 37 may generate various internal control signals for use in the semiconductor memory device 10 in response to the control signals CTRL. For example, the control logic 37 may adjust the levels of voltages to be provided to the wordlines WL and the bitlines BL during a memory operation such as a program operation or an erase operation.

The row decoder 33 may select at least one of the memory cell blocks BLK1 through BLKn in response to the address ADDR, and may select at least one of the wordlines WL of the selected memory cell block, the string selection signal SSL, and the ground selection line GSL. The row decoder 33 may transmit a voltage for performing a memory operation to the selected wordline WL of the selected memory cell block.

The page buffer 35 may be connected to the memory cell array 20 via the bitlines BL. The page buffer 35 may operate as a write driver and/or a sense amplifier. During a program operation, the page buffer 35 may operate as a write driver and may apply a voltage corresponding to data "DATA" to be stored in the memory cell array 20 to the bitlines BL. During a read operation, the page buffer 35 may operate as a sense amplifier and may sense data "DATA" stored in the memory cell array 20.

Figure 2:
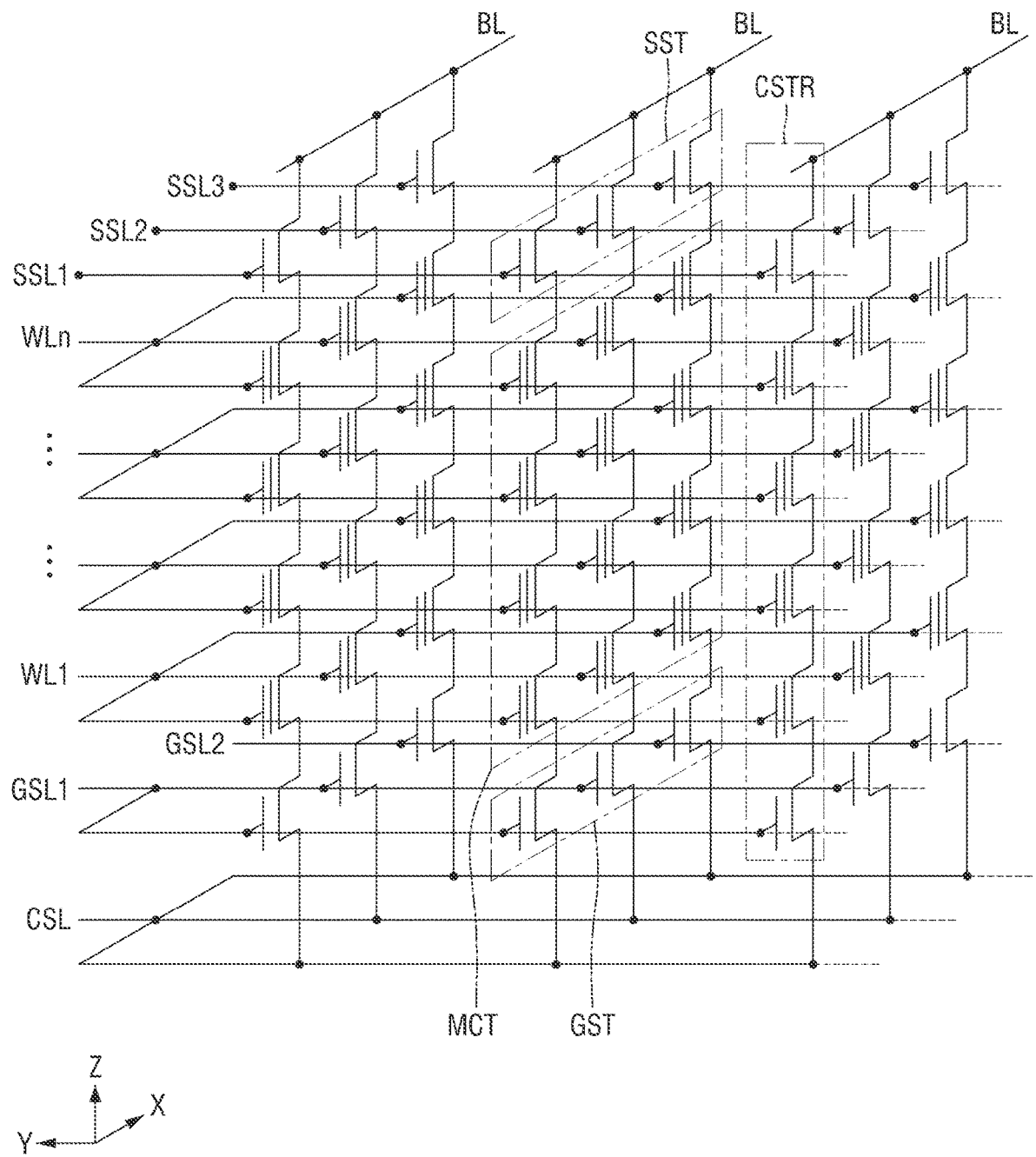
FIG. 2 is a circuit diagram of a semiconductor memory device according to an example embodiment.

FIG. 2 is a circuit diagram of a semiconductor memory device according to an example embodiment.

Referring to FIG. 2, a memory cell array (e.g., the memory cell array 20 of FIG. 1) of the semiconductor memory device may include common source lines CSL, bitlines BL, and cell strings CSTR.

The bitlines BL may be arranged two-dimensionally. For example, the bitlines BL may extend in a first direction X and may be spaced apart from one another in a second direction Y. Multiple cell strings CSTR may be connected in parallel to each of the bitlines BL. The cell strings CSTR may be connected in common to the common source lines CSL. Thus, a plurality of cell strings CSTR may be interposed between the bitlines BL and the common source lines CSL.

The common source lines CSL may be arranged two-dimensionally. For example, the common source lines CSL may be spaced apart from one another in the first direction X and may extend in the second direction Y. Voltages that are electrically identical may be applied to the common source lines CSL. In another implementation, different voltages may be applied to the common source lines CSL to control the common source lines CSL separately.

In an example embodiment, each of the cell strings CSTR may include ground selection transistors GST that are connected to the common source lines CSL, a plurality of string selection transistors SST that are connected to one of the bitlines BL, and a plurality of memory cell transistors MCT that are interposed between the ground selection transistors GST and the string selection transistors SST. Each of the memory cell transistors MCT may include a data storage element. The ground selection transistors GST, the string selection transistors SST, and the memory cell transistors MCT may be connected in series.

The common source lines CSL may be connected in common to the sources of the ground selection transistors GST. Ground selection lines GSL1 and GSL2, a plurality of wordlines WL1 through WLn, and string selection lines SSL1 through SSL3 may be interposed between the common source lines CSL and the bitlines BL.

The ground selection lines GSL1 and GSL2 may be used as the gate electrodes of the ground selection transistors GST, the wordlines WL1 through WLn may be used as the gate electrodes of the memory cell transistors MCT, and the string selection lines SSL1 through SSL3 may be used as the gate electrodes of the string selection transistors SST.

In an example embodiment, one ground selection line (e.g., the ground selection line GSL1) may correspond to two string selection lines (e.g., the string selection lines SSL1 and SSL2). For example, cell strings CSTR connected to the string selection line SSL1 or SSL2 may be connected in common to the ground selection line GSL1.

Figure 3:
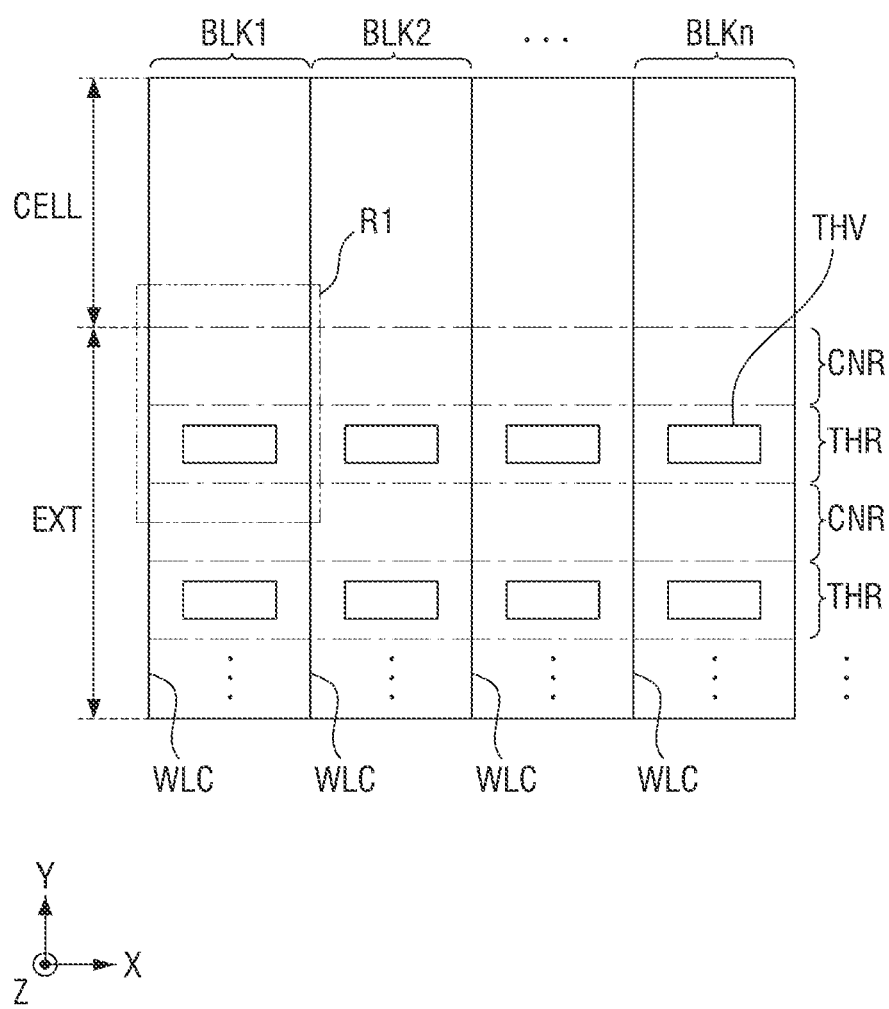
FIG. 3 is a layout view of a semiconductor memory device according to an example embodiment.
Figure 4:
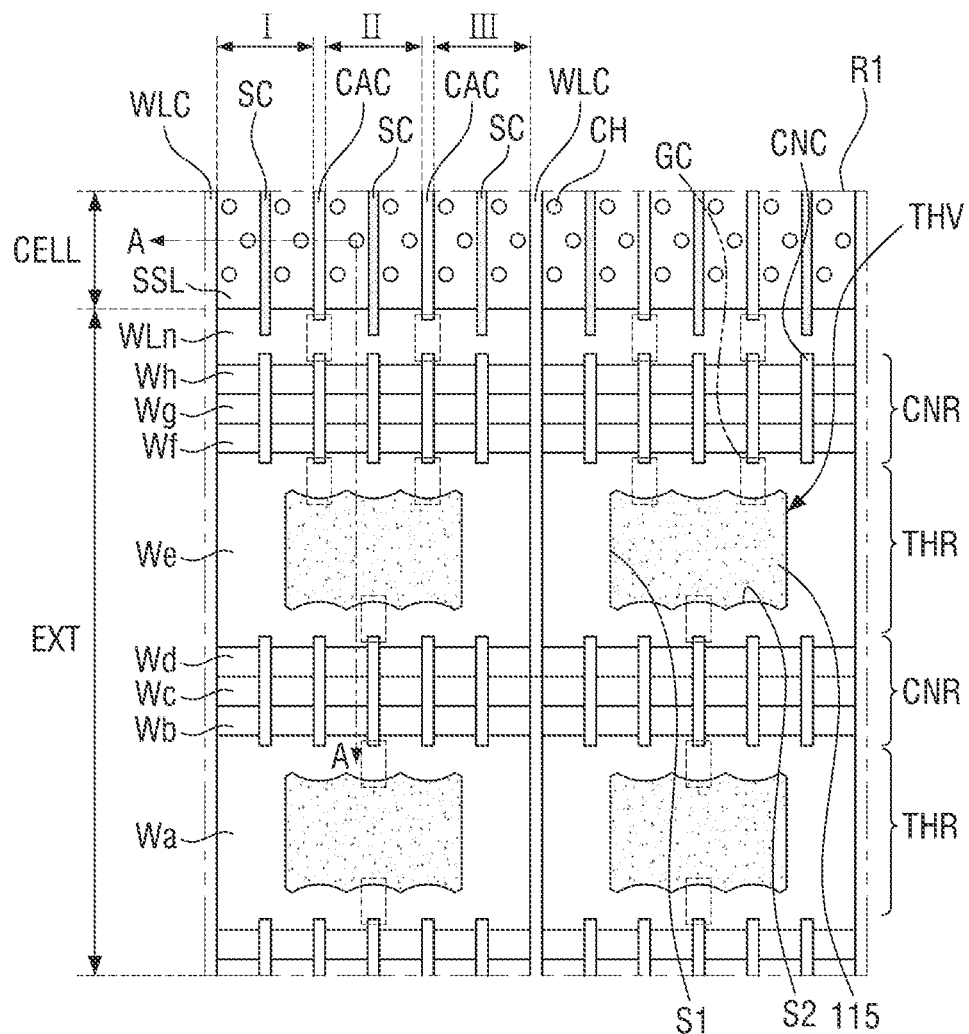
FIG. 4 is a layout view illustrating a region R1 of FIG. 3.
Figure 5:
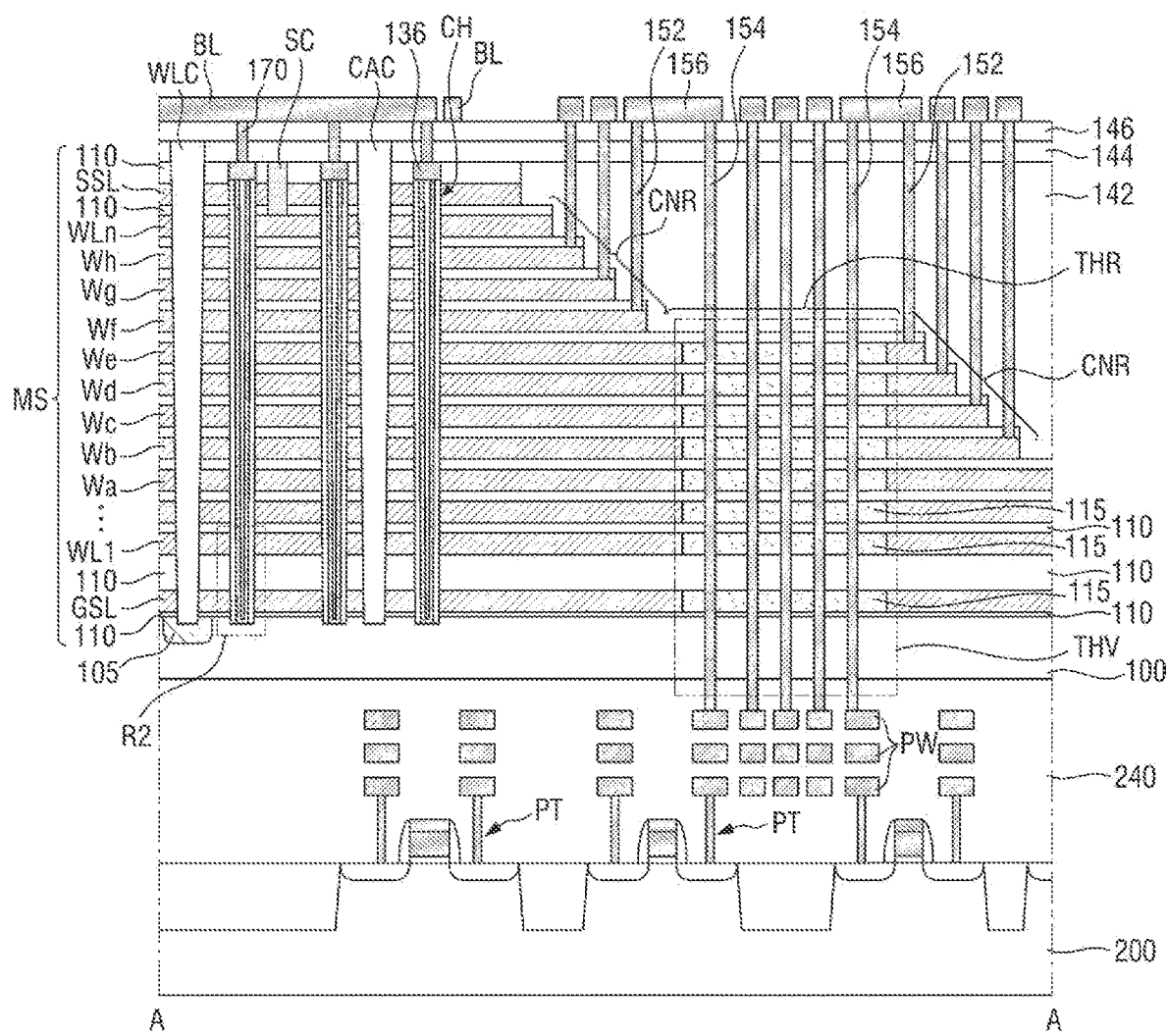
FIG. 5 is a cross-sectional view taken along line A-A of FIG. 4.
Figure 6:
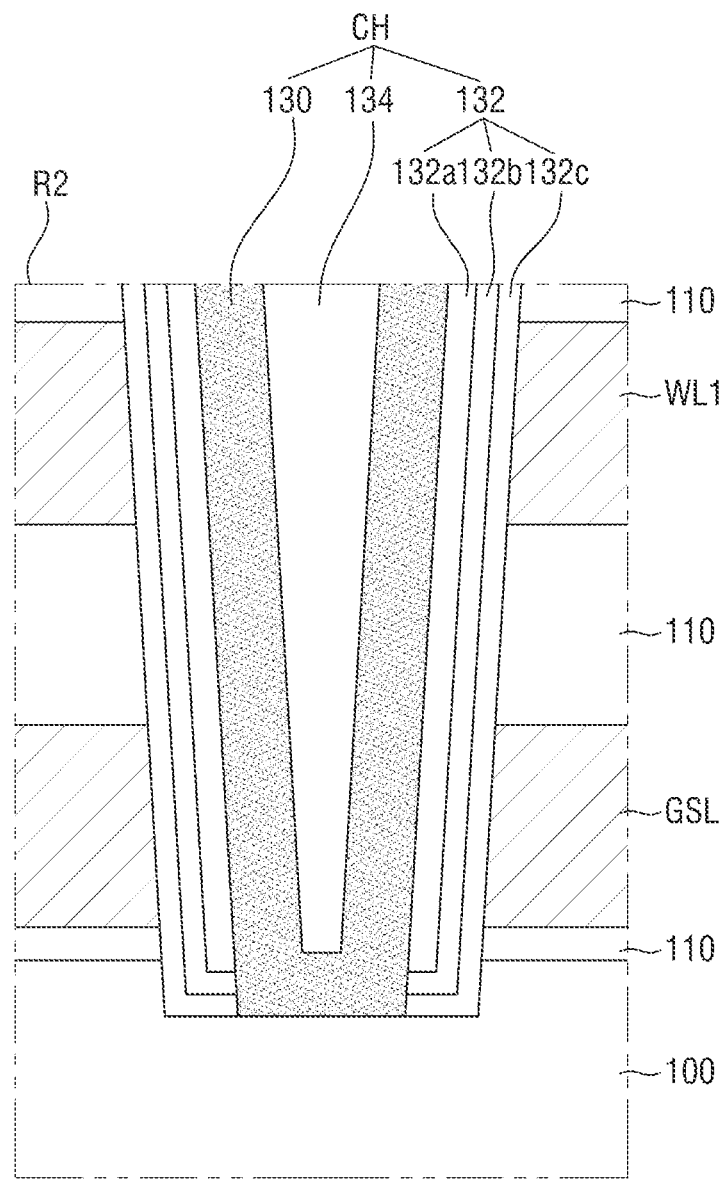
FIGS. 6 and 7 are enlarged cross-sectional views illustrating a region R2 of FIG. 5.
Figure 7:
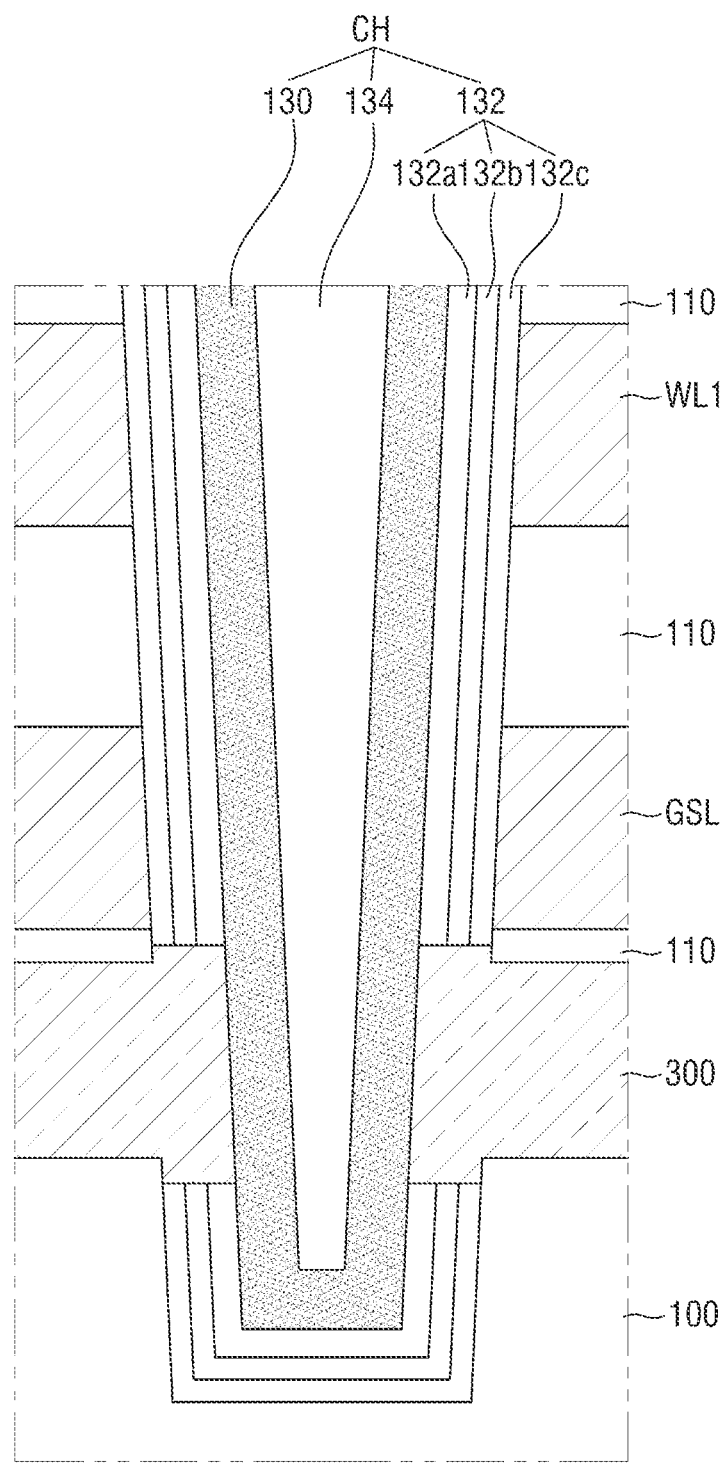

FIG. 3 is a layout view of a semiconductor memory device according to an example embodiment. FIG. 4 is a layout view illustrating a region R1 of FIG. 3. FIG. 5 is a cross-sectional view taken along line A-A of FIG. 4. FIGS. 6 and 7 are enlarged cross-sectional views illustrating a region R2 of FIG. 5.

Referring to FIG. 3, the semiconductor memory device may include a cell array region CELL and an extension region EXT, which may be arranged adjacent to one another in the second direction Y.

The cell array region CELL and the extension region EXT may be cut and divided by a plurality of block isolation regions WLC to form a plurality of memory cell blocks BLK1 through BLKn. For example, the block isolation regions WLC may extend in the second direction Y to cut the cell array region CELL and the extension region EXT.

A memory cell array (e.g., the memory cell array 20 of FIG. 1) including a plurality of memory cells may be formed in the cell array region CELL. For example, channel structures CH and bitlines BL may be formed in the cell array region CELL.

The extension region EXT may be disposed near the cell array region CELL. In an example embodiment, the cell array region CELL and the extension region EXT may be arranged along the direction in which the block isolation regions WLC extend. For example, the cell array region CELL and the extension region EXT may be arranged along the second direction Y. As illustrated in FIG. 5, a plurality of gate electrodes (GSL, WL1 through WLn, and SSL) may be stacked in a stepwise fashion in the extension region EXT.

The extension region EXT may include contact regions CNR and through regions THR. The contact regions CNR and the through regions THR may be alternately arranged along the direction in which the block isolation regions WLC extend, e.g., the contact regions CNR and the through regions THR may be alternately arranged along the second direction Y.

Gate contacts 152, which are connected to the gate electrodes (GSL, WL1 through WLn, and SSL), may be formed in the contact regions CNR of the extension region EXT. Through structures THV may be formed in the through regions THR of the extension region EXT. The contact regions CNR and the through regions THR will be further described below with reference to FIGS. 4 and 5.

Referring to FIGS. 3 through 7, the semiconductor memory device may include a first substrate 100, a mold structure MS, the channel structures CH, the bitlines BL, the block isolation regions WLC, cell gate cutting regions CAC, extension gate cutting regions CNC, the through structures THV, the gate contacts 152, and first through vias 154.

The first substrate 100 may include a semiconductor substrate such as a silicon substrate, a germanium substrate, or a silicon-germanium substrate. In an implementation, the first substrate 100 may include a silicon-on-insulator (SOI) substrate or a germanium-on-insulator (GOI) substrate.

In an example embodiment, the first substrate 100 may include impurity regions 105. The impurity regions 105 may extend in the second direction Y and may be provided as common source lines (e.g., the common source lines CSL of FIG. 2).

The mold structure MS may be formed on the first substrate 100 in the cell array region CELL and the extension region EXT. The mold structure MS may be formed in a stepwise fashion on the first substrate 100 in the extension region EXT.

The mold structure MS may include the gate electrodes (GSL, WL1 through WLn, and SSL) are alternately stacked on the first substrate 100 with a plurality of first insulating patterns 110. For example, the gate electrodes (GSL, WL1 through WLn, and SSL) and the first insulating patterns 110 may form a stratified structure extending in a first direction X and the second direction Y. The gate electrodes (GSL, WL1 through WLn, and SSL) and the first insulating patterns 110 may be alternately stacked in a third direction Z that is perpendicular to the top surface of the first substrate 100. Accordingly, the gate electrodes (GSL, WL1 through WLn, and SSL) may be stacked on the first substrate 100 while being spaced apart from one another.

In an example embodiment, the gate electrodes (GSL, WL1 through WLn, and SSL) may include at least one ground selection line GSL, a plurality of wordlines WL1 through WLn, and at least one string selection line SSL. In an example embodiment, the ground selection line GSL may be a lowermost one of the gate electrodes (GSL, WL1 through WLn, and SSL). In an example embodiment, the string selection line SSL may be an uppermost one of the gate electrodes (GSL, WL1 through WLn, and SSL).

The mold structure MS is illustrated as including one ground selection line GSL and one string selection line SSL, but the mold structure MS may include a plurality of ground selection lines GSL and/or a plurality of string selection lines SSL.

The gate electrodes (GSL, WL1 through WLn, and SSL) may include a metal, such as tungsten (W), cobalt (Co), or nickel (Ni), or a semiconductor material such as silicon (Si). The gate electrodes (GSL, WL1 through WLn, and SSL) may be formed by, for example, a replacement process.

The first insulating patterns 110 may include an insulating material. For example, the first insulating patterns 110 may include an oxide (e.g., silicon oxide).

The channel structures CH may penetrate the mold structure MS. The channel structures CH may extend in a direction that intersects the gate electrodes (GSL, WL1 through WLn, and SSL). For example, the channel structures CH may be in a pillar shape extending in the third direction Z. As illustrated in FIG. 6, each of the channel structures CH may include a semiconductor pattern 130 and an information storage film 132.

The semiconductor pattern 130 may extend in the third direction Z to penetrate the mold structure MS. The semiconductor pattern 130 is illustrated as being in a cup shape but the semiconductor pattern 130 may have various shapes such as a cylindrical shape, a square cylinder shape, or a non-hollow pillar shape. The semiconductor pattern 130 may include a semiconductor material such as, for example, monocrystalline silicon, polycrystalline silicon, an organic semiconductor material, or a carbon nanostructure.

The information storage film 132 may be interposed between the semiconductor pattern 130 and the gate electrodes (GSL, WL1 through WLn, and SSL). For example, the information storage film 132 may extend along the sides of the semiconductor pattern 130. The information storage film 132 may include at least one of, for example, silicon oxide, silicon nitride, silicon oxynitride, and a high-k material having a greater dielectric constant than silicon oxide. The high-k material may include at least one of, for example, aluminum oxide, hafnium oxide, lanthanum oxide, tantalum oxide, titanium oxide, lanthanum hafnium oxide, lanthanum aluminum oxide, dysprosium scandium oxide, and a combination thereof.

In an example embodiment, the information storage film 132 may be formed as a multilayer film. For example, the information storage film 132 may include a tunnel insulating film 132a, a charge storage film 132b, and a blocking insulating film 132c, which are sequentially stacked on the semiconductor pattern 130. The tunnel insulating film 132a may include, for example, silicon oxide or a high-k material (e.g., aluminum oxide ($Al_2O_3$) or hafnium oxide ($HfO_2$)) having a greater dielectric constant than silicon oxide). The charge storage film 132b may include, for example, silicon nitride. The blocking insulating film 132c may include, for example, silicon oxide or a high-k material (e.g., aluminum oxide ($Al_2O_3$) or hafnium oxide ($HfO_2$)) having a greater dielectric constant than silicon oxide).

In an example embodiment, each of the channel structures CH may further include a filler pattern 134. The filler pattern 134 may be formed to fill the inside of the semiconductor pattern 130 having a cup shape. For example, the semiconductor pattern 130 may extend along the sides and the bottom surface of the filler pattern 134. The filler pattern 134 may include an insulating material such as, for example, silicon oxide.

In an example embodiment, each of the channel structures CH may further include a channel pad 136, as illustrated in FIG. 5. The channel pad 136 may be formed to be connected to the top of the semiconductor pattern 130. For example, the channel pad 136 may be formed in a first insulating pattern 110 on the uppermost one (e.g., the string selection line SSL) of the gate electrodes (GSL, WL1 through WLn, and SSL) to be connected to the semiconductor pattern 130. The channel pad 136 may include, for example, polysilicon doped with impurities.

In an example embodiment, the channel structures CH may be arranged in a zigzag fashion. For example, as illustrated in the plan view of FIG. 4, the channel structures CH may be arranged in a staggered manner in the first and second directions X and Y. By arranging the channel structures CH in a zigzag fashion, the integration density of the semiconductor memory device may be increased.

The bitlines BL may be formed on the mold structure MS. For example, the bitlines BL may be formed on first, second, and third interlayer insulating films 142, 144, and 146, which are sequentially stacked on the mold structure MS.

The bitlines BL may extend in the first direction X to be connected to the channel structures CH. For example, as illustrated in FIG. 5, the bitlines BL may be connected to the channel structures CH via bitline contacts 170. The bitline contacts 170 may electrically connect the bitlines BL and the channel structures CH through, for example, the first, second, and third interlayer insulating films 142, 144, and 146.

The block isolation regions WLC may be formed in the cell array region CELL and the extension region EXT to cut the gate electrodes (GSL, WL1 through WLn, and SSL). The block isolation regions WLC may extend in a direction that intersects the bitlines BL. For example, a plurality of block isolation regions WLC may be arranged along the first direction X in the cell array region CELL and the extension region EXT. The block isolation regions WLC may extend in the second direction Y to cut the mold structure MS.

As described above with reference to FIG. 3, the block isolation regions WLC may cut and divide the cell array region CELL and the extension region EXT to form the memory cell blocks BLK1 through BLKn. For example, the block isolation regions WLC may extend in the second direction Y to completely cut the mold structure MS. The mold structure MS may form each of the memory cell blocks BLK1 through BLKn by being cut and divided by each pair of adjacent block isolation regions WLC.

The cell gate cutting regions CAC may be formed in the cell array region CELL to cut the gate electrodes (GSL, WL1 through WLn, and SSL). The cell gate cutting regions CAC may extend in the direction that intersects the bitlines BL. For example, a plurality of cell gate cutting regions CAC may be arranged along the first direction X in the cell array region CELL, and may extend in the second direction Y to cut the mold structure MS in the cell array region CELL.

The cell gate cutting regions CAC may cut and divide the cell array region CELL, and may thus form a plurality of first, second, and third sections I, II, and III in each of the memory cell blocks BLK1 through BLKn. For example, as illustrated in FIG. 4, two cell gate cutting regions CAC may be formed between each pair of adjacent block isolation regions WLC. Accordingly, three sections (e.g., first, second, and third sections I, II, and III) may be formed between each pair of adjacent block isolation regions WLC.

The extension gate cutting regions CNC may be formed in the extension region EXT to cut the gate electrodes (GSL, WL1 through WLn, and SSL). The extension gate cutting regions CNC may extend in the direction that intersects the bitlines BL. For example, a plurality of extension gate cutting regions CNC may be arranged along the first direction X in the extension region EXT. The extension gate cutting regions CNC may extend in the second direction Y to cut the mold structure MS in the extension region EXT.

In an example embodiment, at least some of the extension gate cutting regions CNC may be arranged to overlap with their respective cell gate cutting regions CAC in the second direction Y. For example, as illustrated in FIG. 4, five extension gate cutting regions CNC may be formed between each pair of adjacent block isolation regions WLC, and two of the five extension gate cutting regions CNC may overlap with their respective cell gate cutting regions CAC in the second direction Y.

In an example embodiment, the extension gate cutting regions CNC may be formed in the contact regions CNR of the extended region EXT, but not in the through regions THR of the extended region EXT. For example, the extension gate cutting regions CNC may extend in the second direction Y, but not to encroach upon the through regions THR.

The block isolation regions WLC, the cell gate cutting regions CAC, and the extension gate cutting regions CNC may include at least one of, for example, silicon oxide, silicon nitride, silicon oxynitride, and a high-k material having a greater dielectric constant than silicon oxide.

In an example embodiment, the block isolation regions WLC, the cell gate cutting regions CAC, and the extension gate cutting regions CNC may be formed on the same level. The expression "formed on the same level", as used herein, may indicate that the corresponding elements are formed by the same manufacturing process. For example, the block isolation regions WLC, the cell gate cutting regions CAC, and the extension gate cutting regions CNC may include the same insulating material.

In an example embodiment, the block isolation regions WLC may include a conductive material. For example, the block isolation regions WLC may include conductive patterns and spacers, which isolate the conductive patterns from the mold structure MS. The conductive patterns of the block isolation regions WLC may be connected to the impurity regions 105, and may thus be provided as common source lines (e.g., the common source lines CSL of FIG. 2) of the semiconductor memory device.

In an example embodiment, cutting structures SC may be formed in the mold structure MS in the cell array region CELL to cut the string selection line SSL. The cutting structures SC may be interposed between the block isolation regions WLC to cut the string selection line SSL of the mold structure MS. For example, a plurality of cutting structures SC may be arranged along the first direction X in the cell array region CELL. The cutting structures SC may extend in the second direction Y to cut the string selection line SSL.

In an example embodiment, the cutting structures SC may be interposed between the block isolation regions WLC and the cell gate cutting regions CAC. For example, the cutting structures SC may be interposed between the block isolation regions WLC, which define the first, second, and third regions I, II, and III in each of the memory cell blocks BLK1 through BLKn, and the cell gate cutting regions CAC. Accordingly, the first, second, and third regions I, II, and III in each of the memory cell blocks BLK1 through BLKn may be electrically isolated from one another, and as a result, two string selection line SSL that can be controlled separately may be provided.

Although not specifically illustrated, additional cutting structures SC may be arranged to overlap with their respective cell gate cutting regions CAC in the second direction Y. For example, two additional cutting structures SC may be formed between the first and second regions I and II in each of the memory cell blocks BLK1 through BLKn and between the second and third regions II and III in each of the memory cell blocks BLK1 through BLKn, in the cell array region CELL. Thus, five cutting structures SC may be formed between each pair of adjacent block isolation regions WLC.

String selection lines SSL in the first and second regions I and II in each of the memory cell blocks BLK1 through BLKn may be electrically isolated from each other and may thus be controlled separately, and string selection lines SSL in the second and third regions II and III in each of the memory cell blocks BLK1 through BLKn may be electrically isolated from each other and may thus be controlled separately. Thus, for example, six string selection lines SSL may be formed between each pair of adjacent block isolation regions WLC.

In an example embodiment, the number of extension gate cutting regions CNC formed between each pair of block isolation regions WLC may be the same as, or smaller than, the number of cutting structures SC formed between each pair of adjacent block isolation regions WLC. For example, five cutting structures SC and five (or less than five) extension gate cutting regions CNC may be formed between each pair of adjacent block isolation regions WLC.

The through structures THV may be formed in the through regions THR of the extension region EXT. Each of the through structures THV may include a plurality of second insulating patterns 115 that are spaced apart from one another and are stacked on the first substrate 100. For example, the second insulating patterns 115 may form a stratified structure extending in the first and second directions X and Y.

The second insulating patterns 115 may be stacked on the same level as at least some of the gate electrodes (GSL, WL1 through WLn, and SSL). The expression "stacked on the same level", as used herein, may indicate that the corresponding elements are formed at substantially the same height with respect to the top surface of the first substrate 100. For example, as illustrated in FIG. 5, the second insulating patterns 115 may be stacked on the same level as a gate electrode We exposed in the through regions THR and may be stacked on the same levels as gate electrodes (GSL, WL1, and Wa through Wd) disposed below the gate electrode We.

The first insulating patterns 110 and the second insulating patterns 115 may be alternately stacked in the through regions THR. The second insulating patterns 115 may cut the gate electrodes (GSL, WL1 through WLn, and SSL) in the through regions THR.

Referring to FIG. 4, in an example embodiment, each of the second insulating patterns 115 may include a first side S1 that is straight in a plan view and a second side S2 that is curvy in a plan view. For example, as illustrated in FIG. 4, the second insulating patterns 115 may include first sides S1 that extend straight in the second direction Y. The second insulating patterns 115 may also include second sides S2 that are curvy, e.g., having concave regions.

In an example embodiment, the second sides S2 of the second insulating patterns 115 may form arcs that are centered around ends of the extension gate cutting regions CNC. For example, each of the second sides S2 of the second insulating patterns 115 may correspond to a plurality of extension gate cutting regions CNC and may form a plurality of arcs that are arranged along the first direction X.

The second insulating patterns 115 may include a different insulating material from the first insulating patterns 110. For example, in a case where the first insulating patterns 110 include an oxide (e.g., silicon oxide), the second insulating patterns 115 may include a nitride (e.g., silicon nitride).

In an example embodiment, the length by which the gate electrodes (GSL, WL1 through WLn, and SSL) protrude in the through regions THR may be greater than the length by which the gate electrodes (GSL, WL1 through WLn, and SSL) protrude in the contact regions CNR. For example, as illustrated in FIG. 5, the length by which the gate electrode We exposed in the through regions THR protrudes beyond a gate electrode Wf directly above the gate electrode We may be greater than the length by which a gate electrode Wg exposed in the contact regions CNR protrudes beyond a gate electrode Wh directly above the gate electrode Wg.

Referring to FIG. 4, in an example embodiment, lower cutting regions GC may cut the ground selection lines GSL. As illustrated in FIG. 4, the lower cutting regions GC may be connected to the cell gate cutting regions CAC, the extension gate cutting regions CNC, or the through structures THV to cut the ground selection lines GSL. For example, three ground selection lines GSL that are cut by the cell gate cutting regions CAC, the extension gate cutting regions CNC, the through structures THV, and the lower cutting regions GC may be formed between a pair of adjacent block isolation regions WLC. Accordingly, the first, second, and third regions I, II, and III in each of the memory cell blocks BLK1 through BLKn may be electrically isolated from one another, and as a result, three separately controllable ground selection lines GSL may be provided.

The gate contacts 152 may be formed in the extension region EXT. The gate contacts 152 may be connected to the gate electrodes (GSL, WL1 through WLn, and SSL). For example, the gate contacts 152 may be connected to the gate electrodes (GSL, WL1 through WLn, and SSL) through the first, second, and third interlayer insulating films 142, 144, and 146.

In an example embodiment, the gate contacts 152 may be formed in the contact regions CNR of the extension region EXT. For example, as illustrated in FIG. 5, gate electrodes Wa through Wh exposed in the contact regions CNR may be arranged in a stepwise fashion. The gate contacts 152 may be arranged in a stepwise fashion to be connected to ends of the gate electrodes Wa through Wh.

First through vias 154 may be formed in the through regions THR of the extension region EXT. The first through vias 154 may penetrate the through structures THV. For example, the first through vias 154 may extend in the third direction Z in the through regions THR to penetrate the first insulating patterns 110 and the second insulating patterns 115.

In an example embodiment, the first through vias 154 may be connected to the gate contacts 152. For example, connecting wires 156 may be formed on the third interlayer insulating film 146. The gate contacts 152 and the first through vias 154 may be connected to the connecting wires 156 through the first, second, and third interlayer insulating films 142, 144, and 146. Accordingly, the connecting wires 156 may connect the gate contacts 152 and the first through vias 154.

In an example embodiment, a second substrate 200 and peripheral circuit elements PT may be formed below the first substrate 100.

The second substrate 200 may include a semiconductor substrate such as, for example, a silicon substrate, a germanium substrate, or a silicon-germanium substrate. In an implementation, the second substrate 200 may include an SOI substrate or a GOI substrate.

The peripheral circuit elements PT may be formed on the second substrate 200. The peripheral circuit elements PT may configure a peripheral circuit (e.g., the peripheral circuit 30 of FIG. 1) that controls operations of memory cells. For example, the peripheral circuit elements PT may include a row decoder (e.g., the row decoder 33 of FIG. 1), a page buffer (e.g., the page buffer 35 of FIG. 1), and a control logic (e.g., the control logic 37 of FIG. 1).

The peripheral circuit elements PT may include, for example, transistors. The peripheral circuit elements PT may include various active elements such as transistors, and/or various passive elements such as capacitors, resistors, or inductors.

In an example embodiment, the first through vias 154 may be connected to the peripheral circuit elements PT. For example, a fourth interlayer insulating film 240 that covers the peripheral circuit elements PT may be formed on the second substrate 200, and peripheral circuit wires PW may be formed in the fourth interlayer insulating film 240. The first through vias 154 may be connected to the peripheral circuit elements PT via the peripheral circuit wires PW.

Referring to FIGS. 5 and 7, the semiconductor memory device may further include a source structure 300.

The source structure 300 may be formed on the first substrate 100. In an example embodiment, the source structure 300 may be interposed between the first substrate 100 and the mold structure MS. The source structure 300 may include, for example, polysilicon doped with impurities or a metal.

In an example embodiment, the channel structures CH may be connected to the first substrate 100 through the source structure 300. For example, as illustrated in FIG. 7, a lower part of the channel structures CH may be buried in the first substrate 100 through the source structure 300.

In an example embodiment, the source structure 300 may be formed to be connected to the semiconductor patterns 130 of the channel structures CH. For example, the source structure 300 may be connected to the semiconductor patterns 130 through the information storage films 132.

In an example embodiment, part of the source structure 300 near the semiconductor pattern 130 may project toward the information storage film 132. For example, the length by which the source structure 300 extends in the third direction Z may be greater near the semiconductor pattern 130 than anywhere else, and this structure may be formed by the characteristics of etching for removing part of the information storage film 132 to form the source structure 300.

Figure 8:
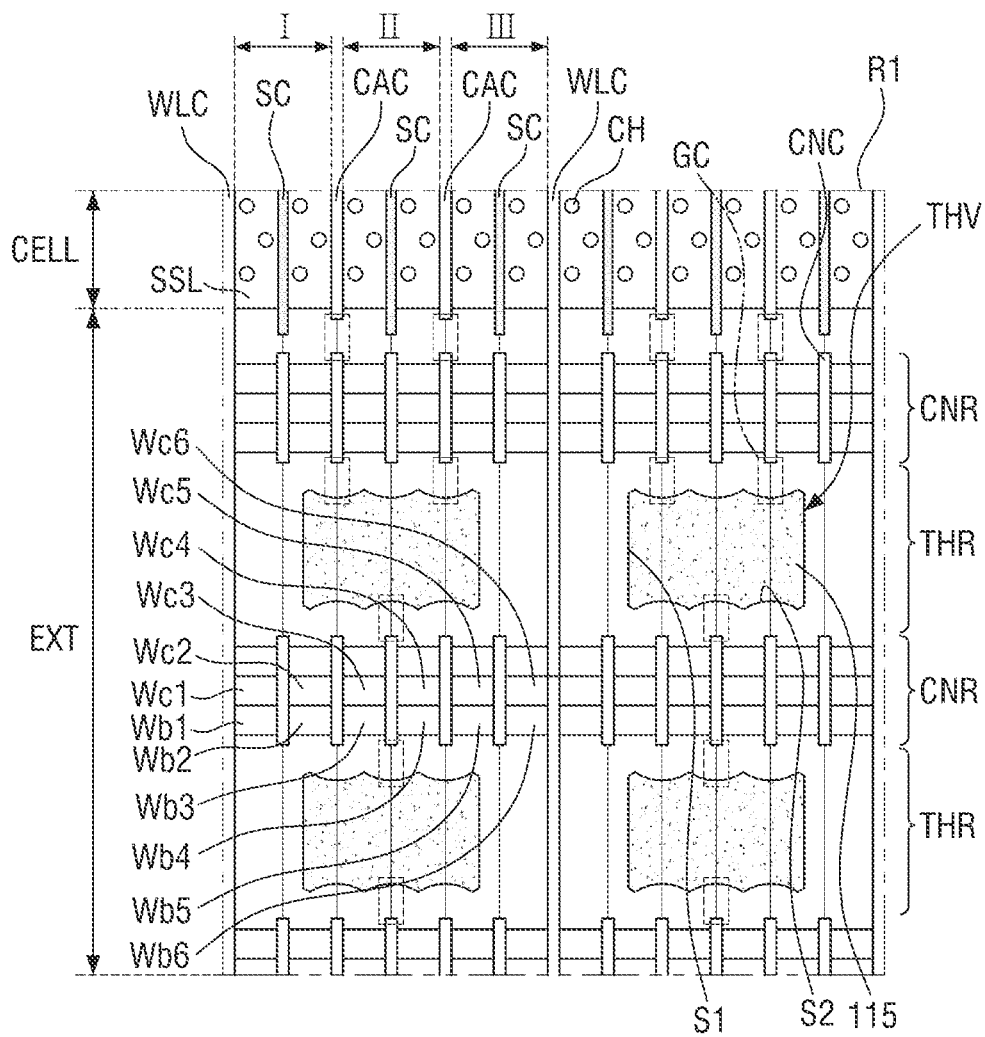
FIG. 8 is a layout view of a semiconductor memory device according to an example embodiment.
Figure 9:
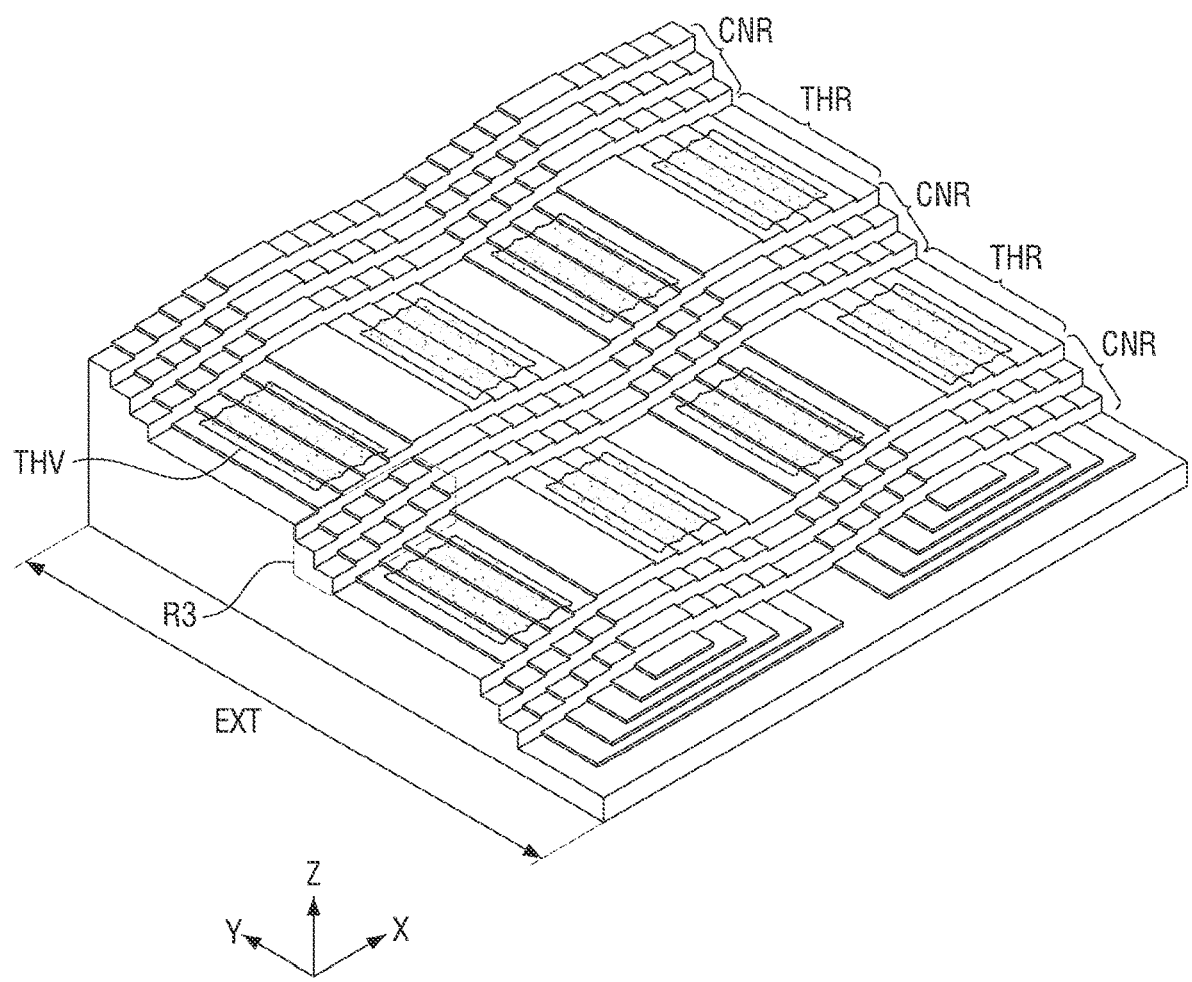
FIG. 9 is a perspective view illustrating an extension region of FIG. 8.
Figure 10:
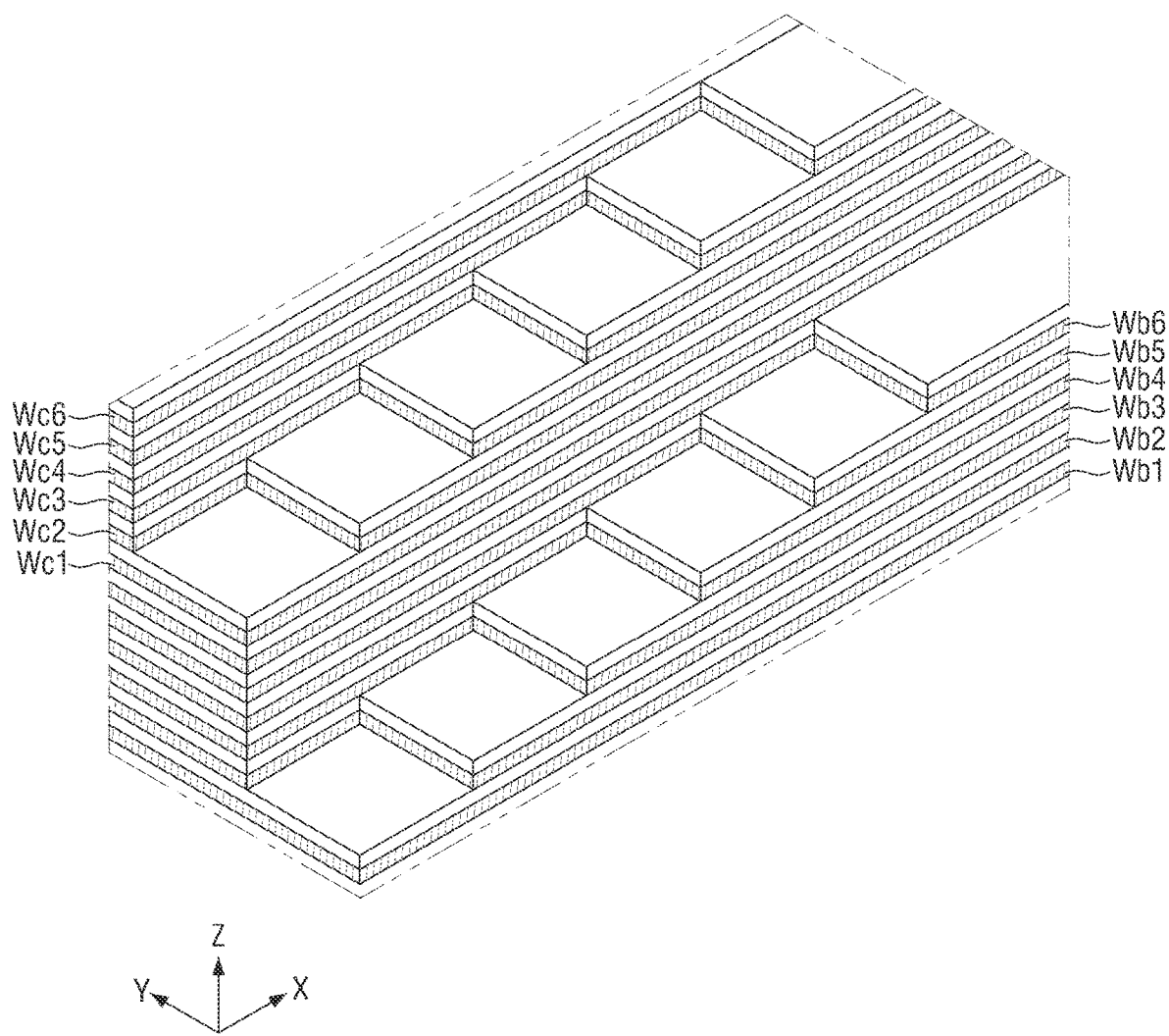
FIG. 10 is an enlarged perspective view illustrating a region R3 of FIG. 9.

FIG. 8 is a layout view of a semiconductor memory device according to an example embodiment. FIG. 9 is a perspective view illustrating an extension region of FIG. 8. FIG. 10 is an enlarged perspective view illustrating a region R3 of FIG. 9. Specifically, FIG. 8 is a layout view of a region R1 (of FIG. 3) of a semiconductor memory device according to an example embodiment. For convenience, descriptions of the elements or features that have already been described above with reference to FIGS. 1 through 7 may be omitted or simplified. Also, for convenience, extension gate cutting regions CNC are not illustrated in FIGS. 9 and 10.

Referring to FIGS. 8 through 10, a plurality of gate electrodes (GSL, WL1 through WLn, and SSL) of an extension region EXT may be stacked in a stepwise fashion in first and second directions X and Y.

As illustrated in FIG. 9, in contact regions CNR of the extension region EXT, the gate electrodes (GSL, WL1 through WLn, and SSL) may be stacked in a stepwise fashion in both the first and second directions X and Y. For example, as illustrated in FIG. 10, gate electrodes from different layers in the second direction Y (e.g., Wb1 and Wc1, Wb2 and Wc2, Wb3 and Wc3, Wb4 and Wc4, Wb5 and Wc5, or Wb6 and Wc6) may have height differences in the second direction Y. Also, gate electrodes from different layers in the first direction X (e.g., Wb1 through Wb6 or Wc1 through Wc6) may have height differences in the first direction X.

In an example embodiment, in through regions THR of the extension region EXT, the gate electrodes (GSL, WL1 through WLn, and SSL) may be stacked in a stepwise fashion only in the first direction X. For example, as illustrated in FIG. 9, the top surfaces of through structures THV, which are formed in the through regions THR, may have height differences only in the first direction X.

In an example embodiment, the number of steps formed in the first direction X between each pair of adjacent block isolation regions WLC may be the same as, or smaller than, the number of string selection lines SSL formed between each pair of adjacent block isolation regions WLC. For example, as illustrated in FIG. 8, six steps and six string selection lines SSL may be formed between each pair of adjacent block isolation regions WLC along the first direction X.

Figure 11:
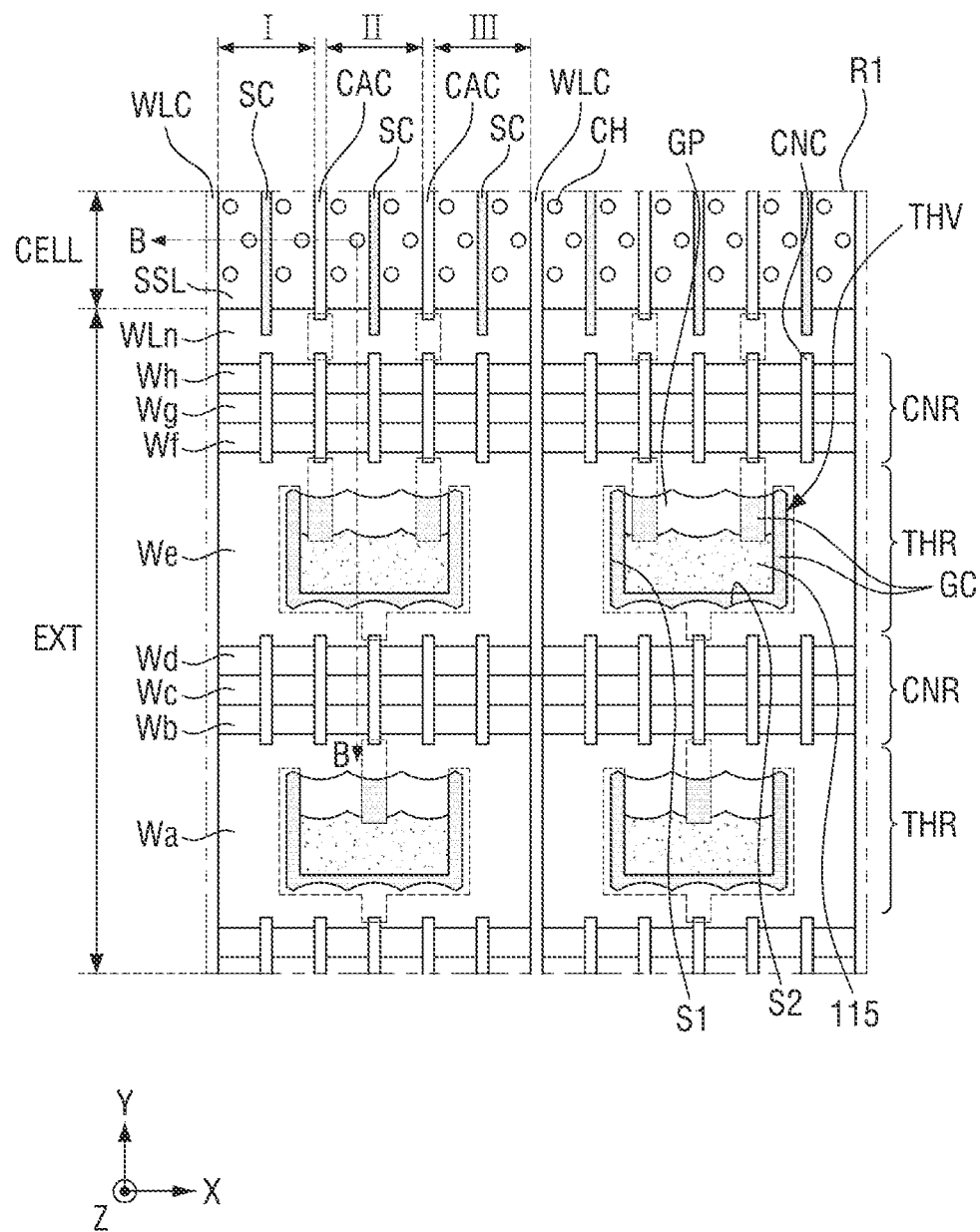
FIG. 11 is a layout view of a semiconductor memory device according to an example embodiment.
Figure 12:
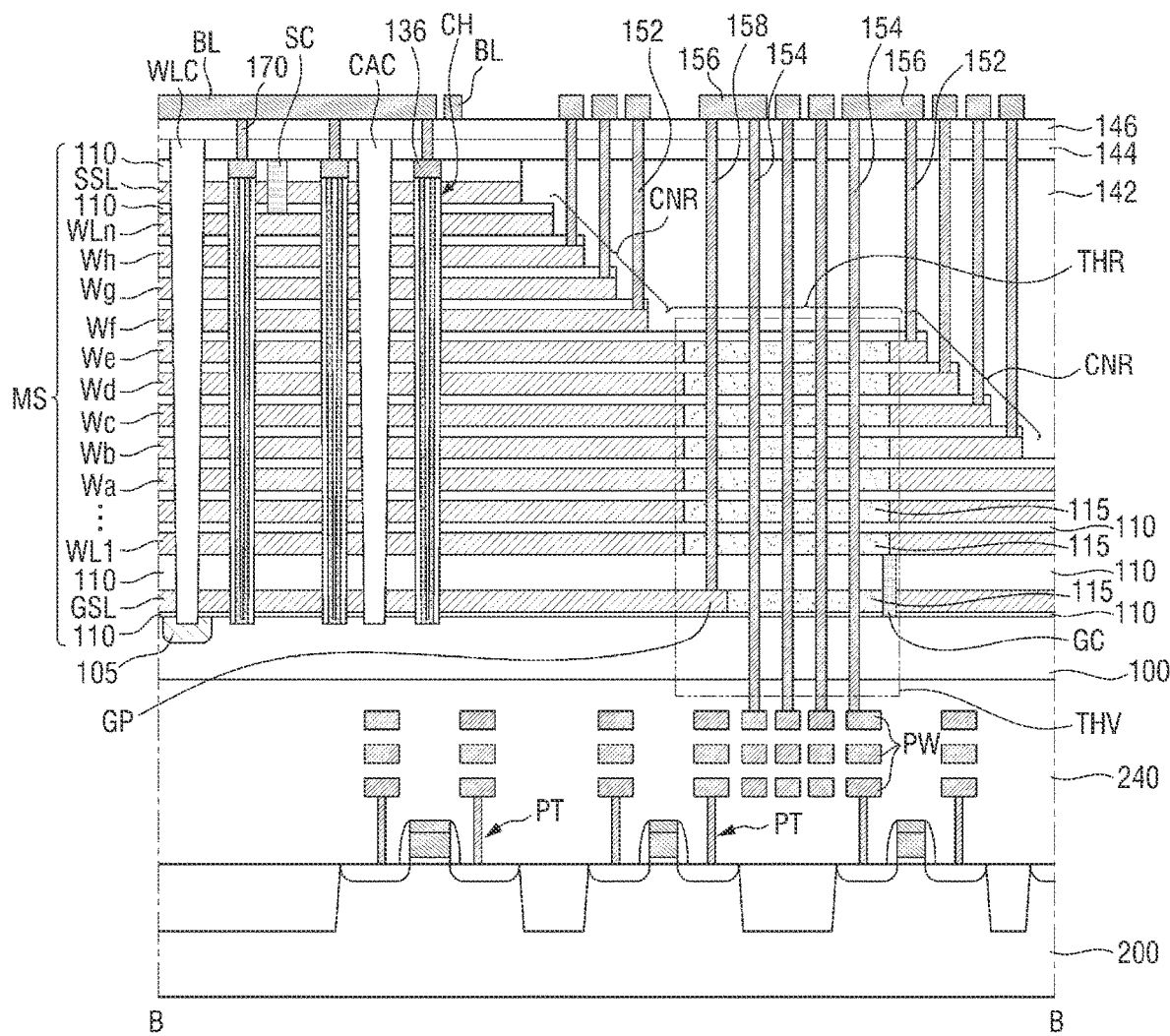
FIGS. 12 and 13 are cross-sectional views taken along line B-B of FIG. 11.
Figure 13:
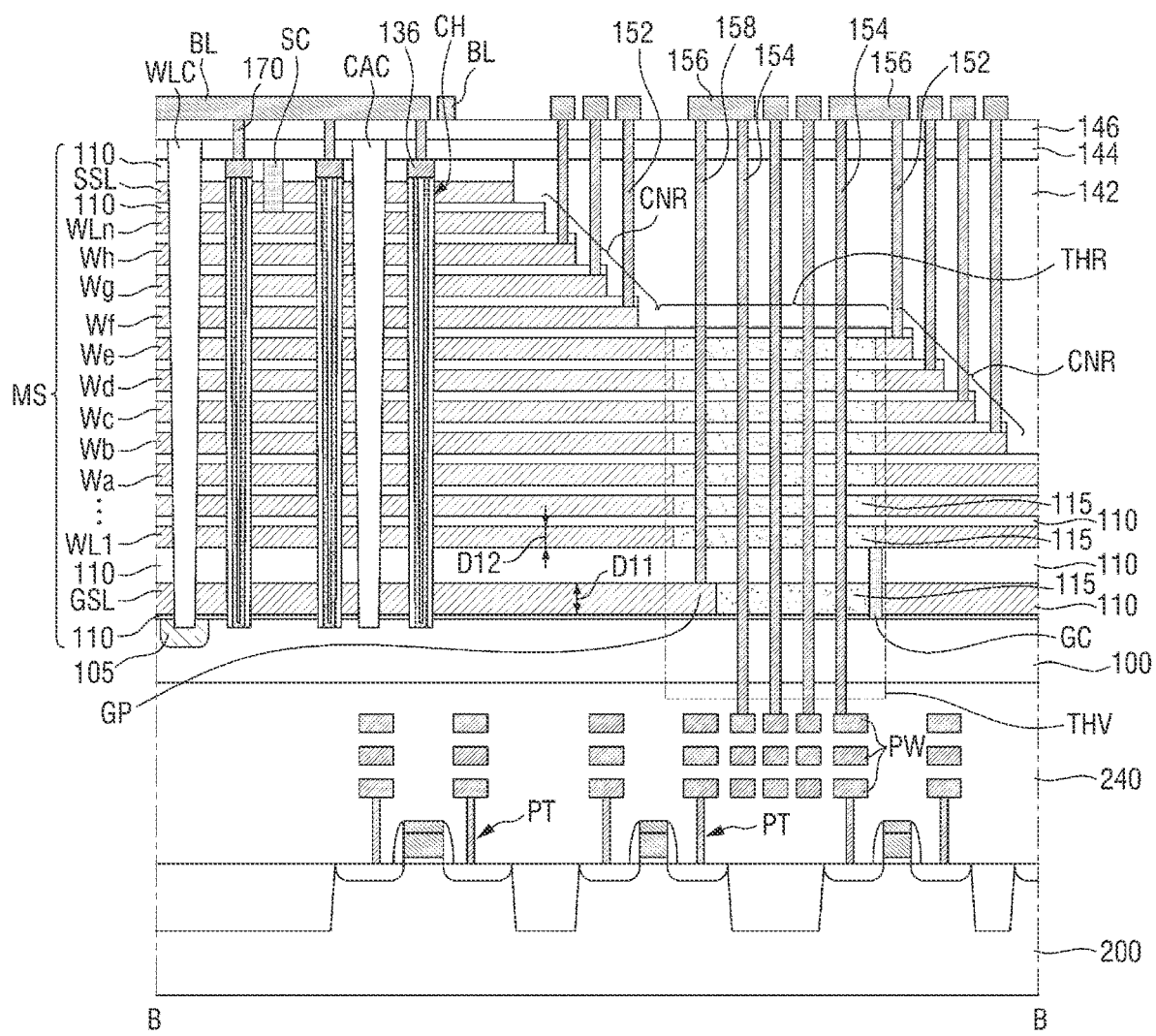

FIG. 11 is a layout view of a semiconductor memory device according to an example embodiment. FIGS. 12 and 13 are cross-sectional views taken along line B-B of FIG. 11. Specifically, FIG. 11 is a layout view of a region R1 (of FIG. 3) of a semiconductor memory device according to an example embodiment. For convenience, descriptions of the elements or features that have already been described above with reference to FIGS. 1 through 7 may be omitted or simplified.

Referring to FIGS. 11 through 13, at least one of a plurality of gate electrodes (GSL, WL1 through WLn, and SSL) may overlap with through structures THV in a third direction Z.

For example, as illustrated in FIG. 11, at least one of the gate electrodes (GSL, WL1 through WLn, and SSL) may include protruding parts GP that overlap with the through structures THV in the third direction Z.

In an example embodiment, the lowermost one of the gate electrodes (GSL, WL1 through WLn, and SSL), for example, ground selection lines GSL, may include protruding parts GP. For example, as illustrated in FIG. 12, the ground selection lines GSL may include protruding parts GP that protrude beyond the other gate electrodes (i.e., WL1 through WLn and SSL) toward through structures THV. Accordingly, the protruding parts GP of the ground selection lines GSL may overlap with a plurality of second insulating patterns 115 in the third direction Z.

In an example embodiment, second insulating patterns 115 corresponding to a gate electrode having protruding parts GP may include a material with a different etching rate from second insulating patterns 115 corresponding to the other gate electrodes such that an etch selectivity exists. For example, the ground selection lines GSL may include protruding parts GP. In this example, second insulating patterns 115 corresponding to the ground selection lines GSL may have a different nitrogen ratio from second insulating patterns 115 corresponding to the other gate electrodes (i.e., WL1 through WLn and SSL).

In an example embodiment, the amount by which the second insulating patterns 115 corresponding to the ground selection lines GSL are etched may be increased as compared to the amount by which the second insulating patterns 115 corresponding to the other gate electrodes (i.e., WL1 through WLn and SSL) are etched. Accordingly, the ground selection lines GSL may include protruding parts GP that protrude beyond the other gate electrodes (i.e., WL1 through WLn and SSL) toward the through structures THV.

In an example embodiment, lower cutting regions GC may be formed to cut the ground selection lines GSL. As illustrated in FIGS. 11 and 12, the lower cutting regions GC may be connected to cell gate cutting regions CAC, extension gate cutting regions CNC, or the through structures THV to cut the ground selection lines GSL.

In an example embodiment, the protruding parts GP may protrude toward through structures THV where the lower cutting regions GC are not formed. For example, referring to FIG. 11, some of the lower cutting regions GC may surround the left sides, right sides, and bottom surfaces of the through structures THV. In this case, the protruding parts GP may protrude only from the top surfaces of the through structures THV toward the through structures THV.

During a process of forming the gate electrodes (GSL, WL1 through WLn, and SSL) (e.g., during a replacement process), the lower cutting regions GC may prevent the second insulating patterns 115 corresponding to the ground selection lines GSL from being etched. As a result, the lower cutting regions may be used adjust areas in which the protruding parts GP are to be formed.

In an example embodiment, second through vias 158 that are connected to the protruding parts GP may be formed in the through regions THR of the extension region EXT. The second through vias 158 may be connected to the protruding parts GP through the through structures THV. For example, the second through vias 158 may extend in the third direction Z in the through regions THR to penetrate a plurality of first insulating patterns 110 and a plurality of second insulating patterns 115.

In an example embodiment, the second through vias 158 may be connected to the first through vias 154. For example, connecting wires 156 may be formed on a third interlayer insulating film 146. The first through vias 154 and the second through vias 158 may be connected to the connecting wires 156 through first and second interlayer insulating films 142 and 144 and through the third interlayer insulating film 146. Accordingly, the connecting wires 156 may connect the first through vias 154 and the second through vias 158. In an example embodiment, the ground selection lines GSL may be connected to peripheral circuit elements PT via the first through vias 154.

Referring to FIGS. 11 and 13, the thickness of a gate electrode including protruding parts GP may be greater than the thickness of other gate electrodes not including protruding parts GP. For example, the ground selection lines GSL may include protruding parts GP. A thickness D11 of the ground selection lines GSL may be greater than a thickness D12 of other gate electrodes (e.g., WL1) stacked on the ground selection lines GSL. In this example, the amount by which the second insulating patterns 115 corresponding to the ground selection lines GSL are etched during the process of forming the gate electrodes (GSL, WL1 through WLn, and SSL) (e.g., during a replacement process) may be increased. Accordingly, the ground selection lines GSL may include protruding parts GP that protrude beyond the other gate electrodes (i.e., WL1 through WLn and SSL) toward the through structures THV.

Figure 14:
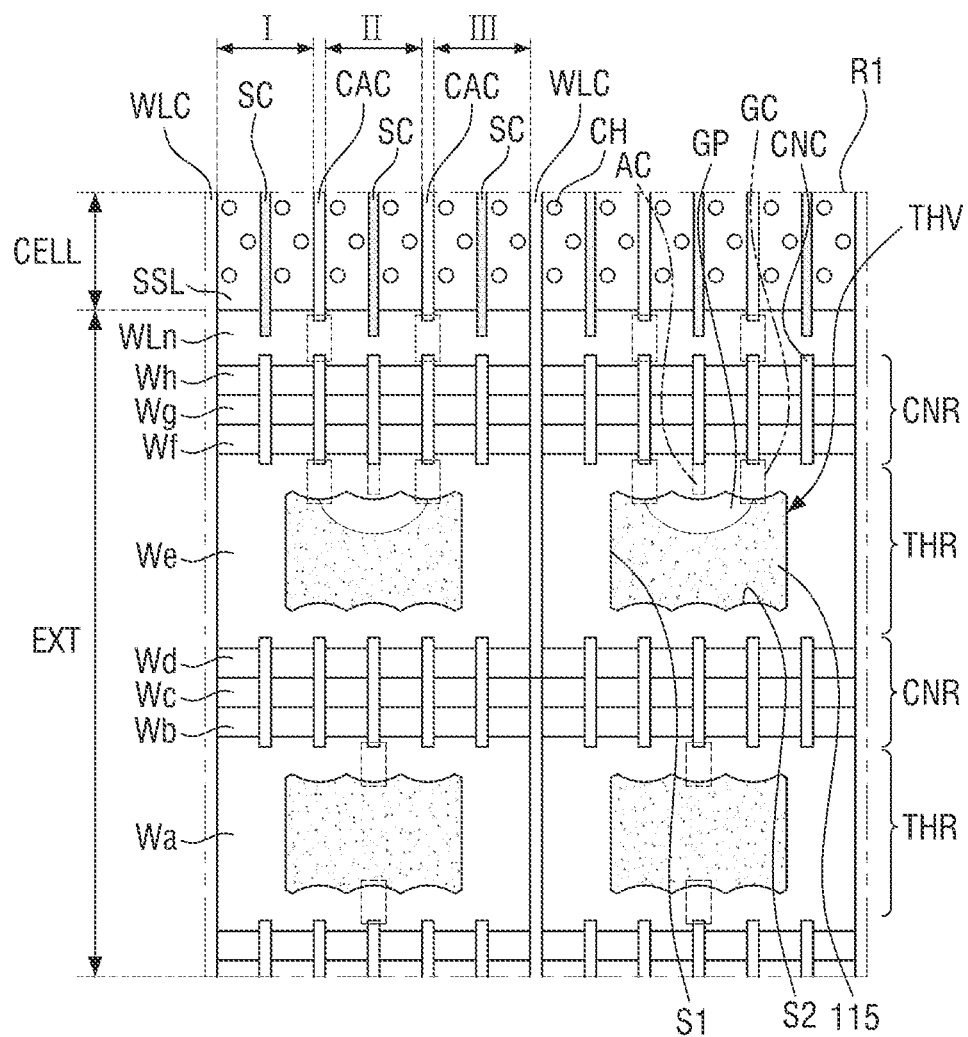
FIG. 14 is a layout view of a semiconductor memory device according to an example embodiment.

FIG. 14 is a layout view of a semiconductor memory device according to an example embodiment. Specifically, FIG. 14 is a layout view of a region R1 (of FIG. 3) of a semiconductor memory device according to an example embodiment. For convenience, descriptions of the elements or features that have already been described above with reference to FIGS. 1 through 13 may be omitted or simplified.

Referring to FIG. 14, the semiconductor memory device further includes additional cutting regions AC that cut ground selection lines GSL. The additional cutting regions AC may extend from extension gate cutting regions CNC that cut the ground selection lines GSL. For example, the additional cutting regions AC may extend in a second direction Y in the ground selection lines GSL to be connected to the extension gate cutting regions GNC that cut the ground selection lines GSL. Thus, the additional cutting regions AC may cut the ground selection lines GSL together with the extension gate cutting regions CNC. The additional cutting regions AC may be adjacent to protruding parts GP.

The amount by which second insulating patterns 115 corresponding to the ground selection lines GSL where the additional cutting regions AC are formed are etched during a process of forming a plurality of gate electrodes (GSL, WL1 through WLn, and SSL) (e.g., during a replacement process) may be increased. Accordingly, the ground selection lines GSL may include protruding parts GP that protrude beyond the other gate electrodes (i.e., WL1 through WLn and SSL) toward through structures THV.

Figure 15:
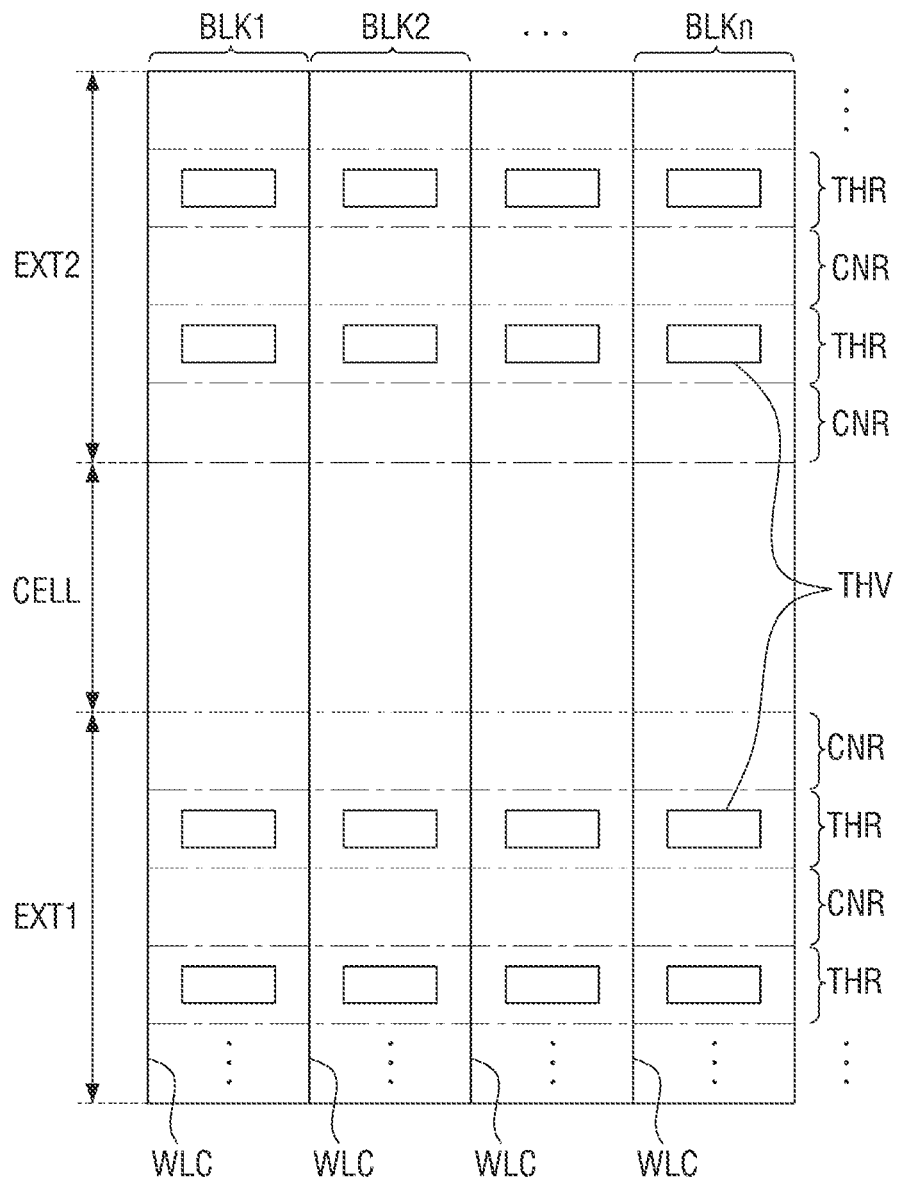
FIG. 15 is a layout view of a semiconductor memory device according to an example embodiment.

FIG. 15 is a layout view of a semiconductor memory device according to an example embodiment. For convenience, descriptions of the elements or features that have already been described above with reference to FIGS. 1 through 7 may be omitted or simplified.

Referring to FIG. 15, the semiconductor memory device includes first and second extension regions EXT1 and EXT2.

The first and second extension regions EXT1 and EXT2 may be disposed on both sides of a cell array region CELL. For example, the first extension region EXT1, the cell array region CELL, and the second extension region EXT2 may be sequentially arranged along a second direction Y.

The first and second extension regions EXT1 and EXT2 may be substantially the same as the extension region EXT of FIGS. 1 through 7, and thus, a detailed description thereof will not be repeated Each of the first and second extension regions EXT1 and EXT2 may include contact regions CNR and through regions THR.

In an example embodiment, the first and second extension regions EXT1 and EXT2 may be arranged symmetrically with respect to the cell array region CELL.

Figure 16:
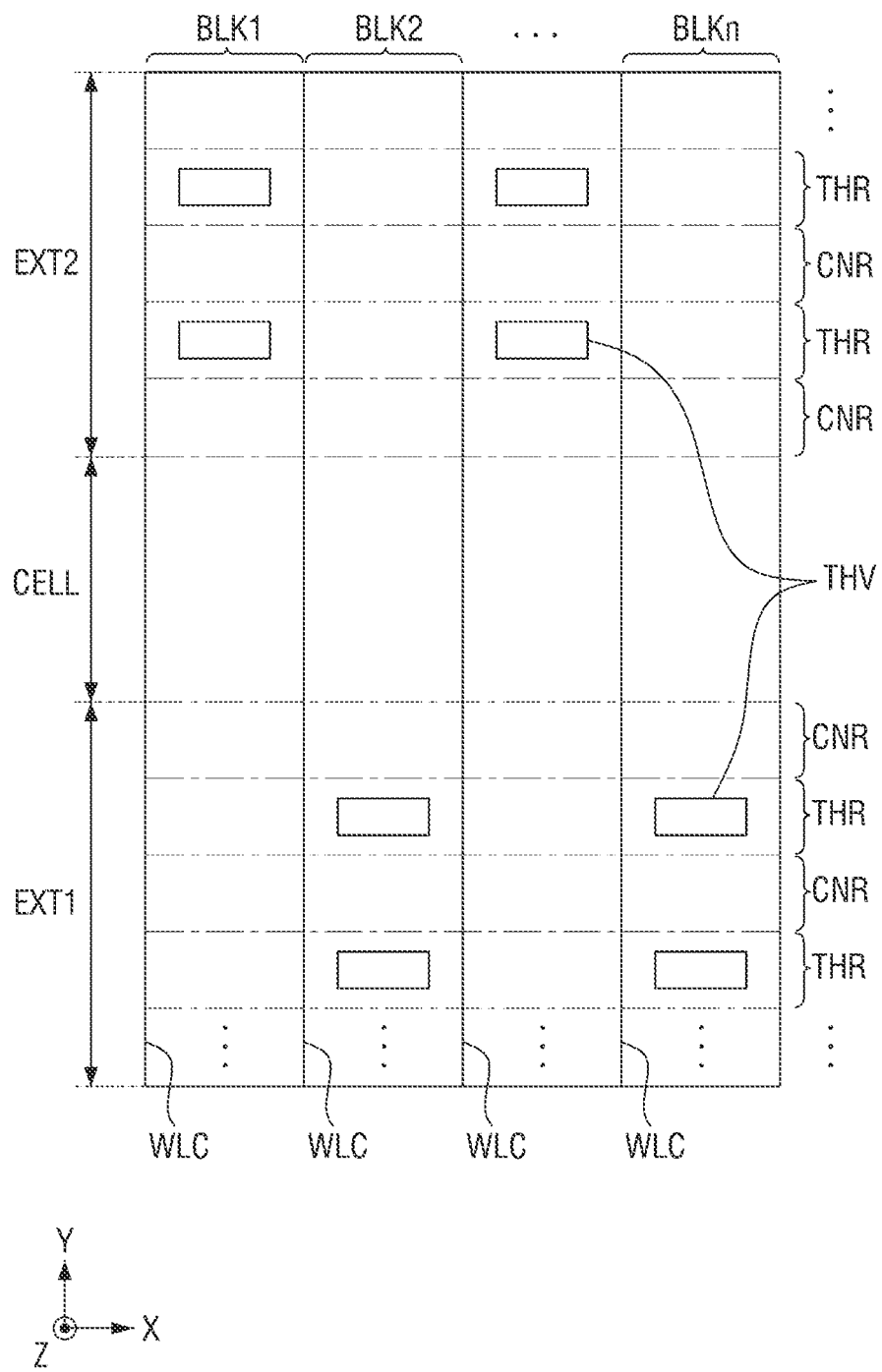
FIG. 16 is a layout view of a semiconductor memory device according to an example embodiment.

FIG. 16 is a layout view of a semiconductor memory device according to an example embodiment. For convenience, descriptions of the elements or features that have already been described above with reference to FIGS. 1 through 15 may be omitted or simplified.

Referring to FIG. 16, through structures THV in a first extension region EXT1 and through structures THV in a second extension region EXT may be arranged in a zigzag fashion.

For example, for a memory cell block BLK1, through structures THV may be formed in the second extension region EXT2, but not in the first extension region EXT1. Also, for example, for a memory cell block BLK2, through structures THV may be formed in the first extension region EXT1, but not in the second extension region EXT2.

Figure 17:
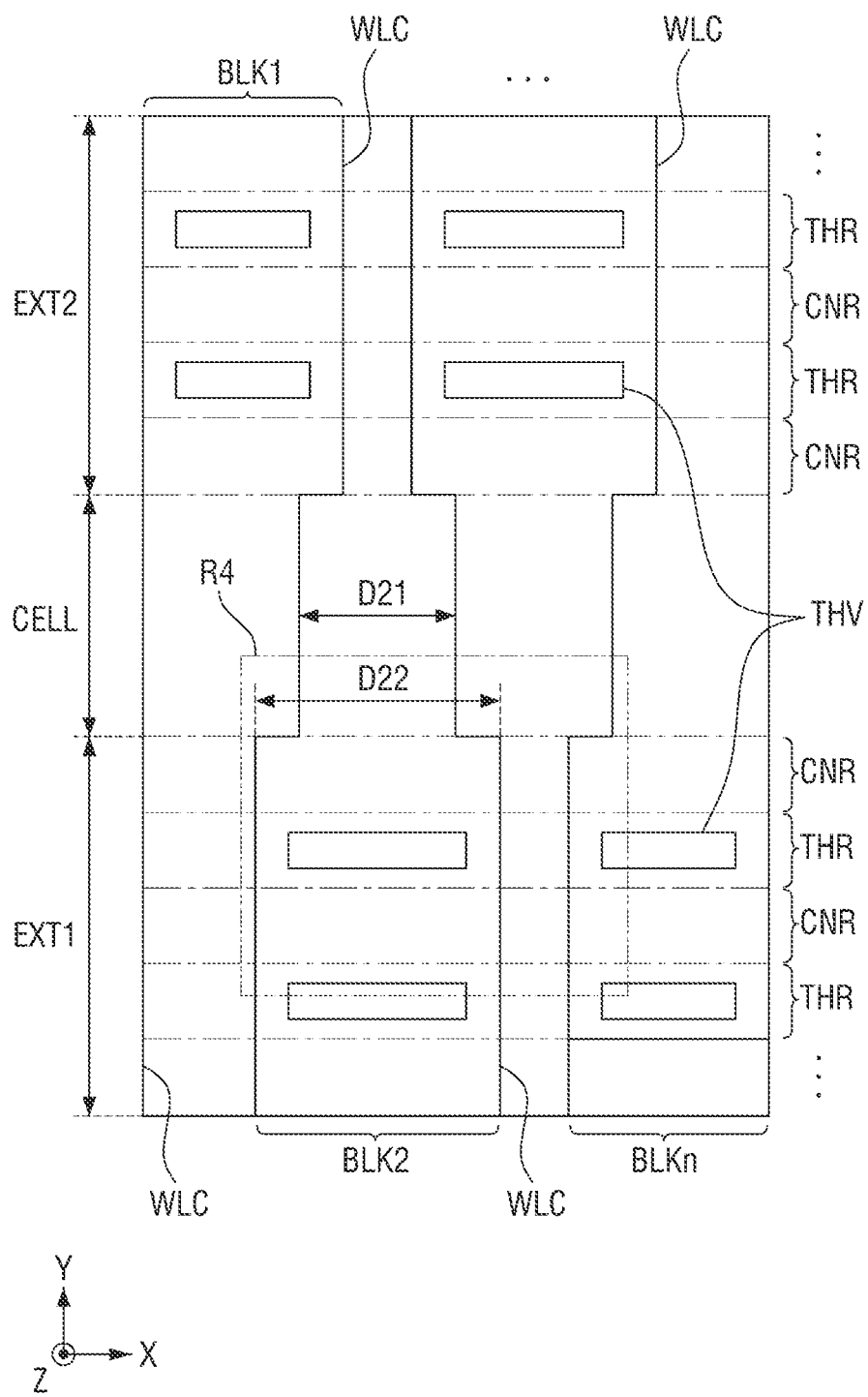
FIG. 17 is a layout view of a semiconductor memory device according to an example embodiment.
Figure 18A:
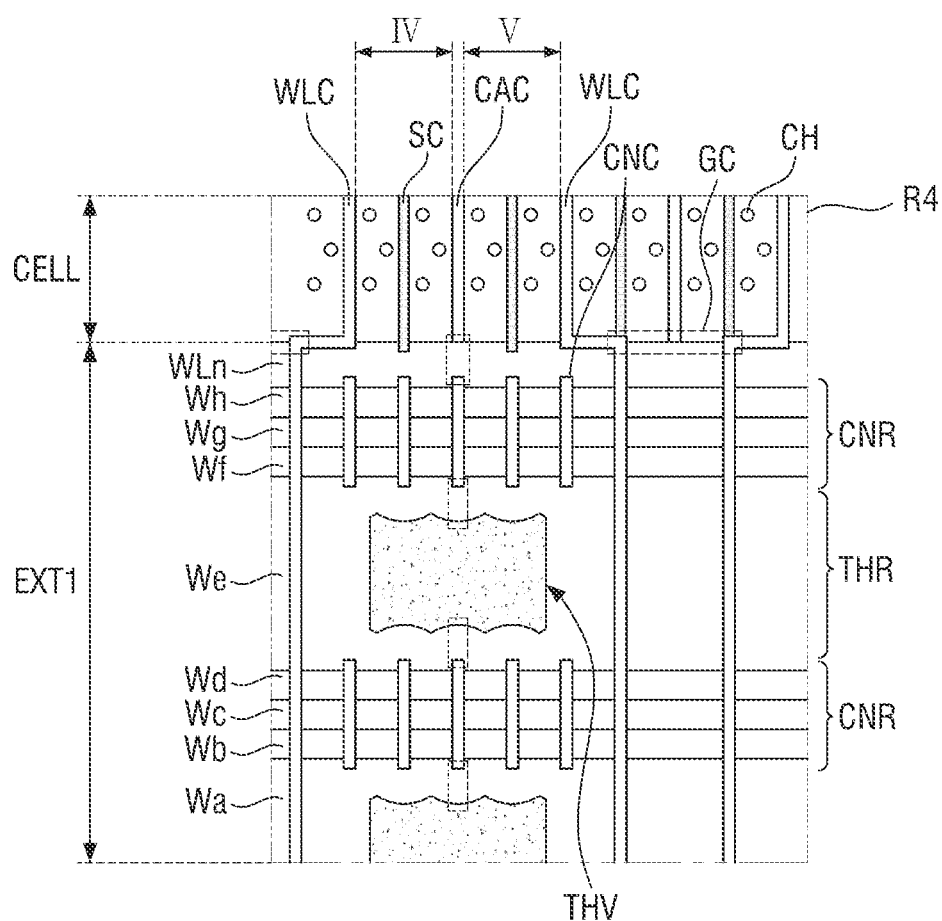
FIGS. 18A through 18C are layout views illustrating a region R4 of FIG. 17.
Figure 18B:
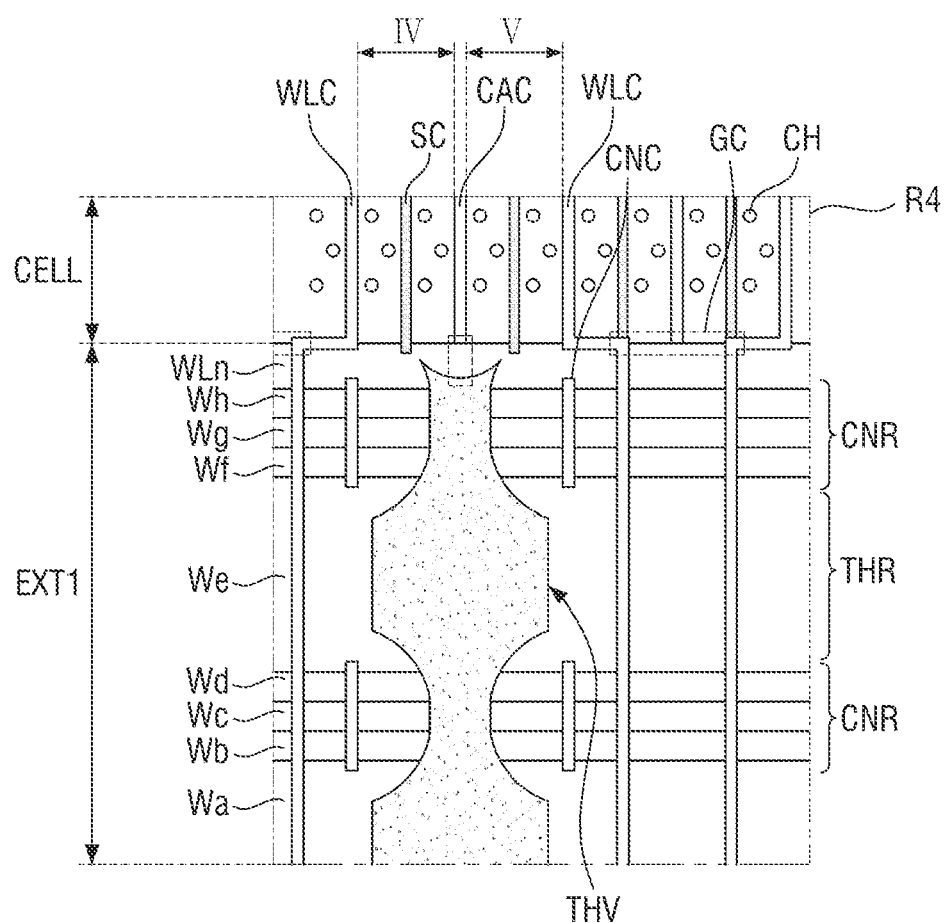
Figure 18C:
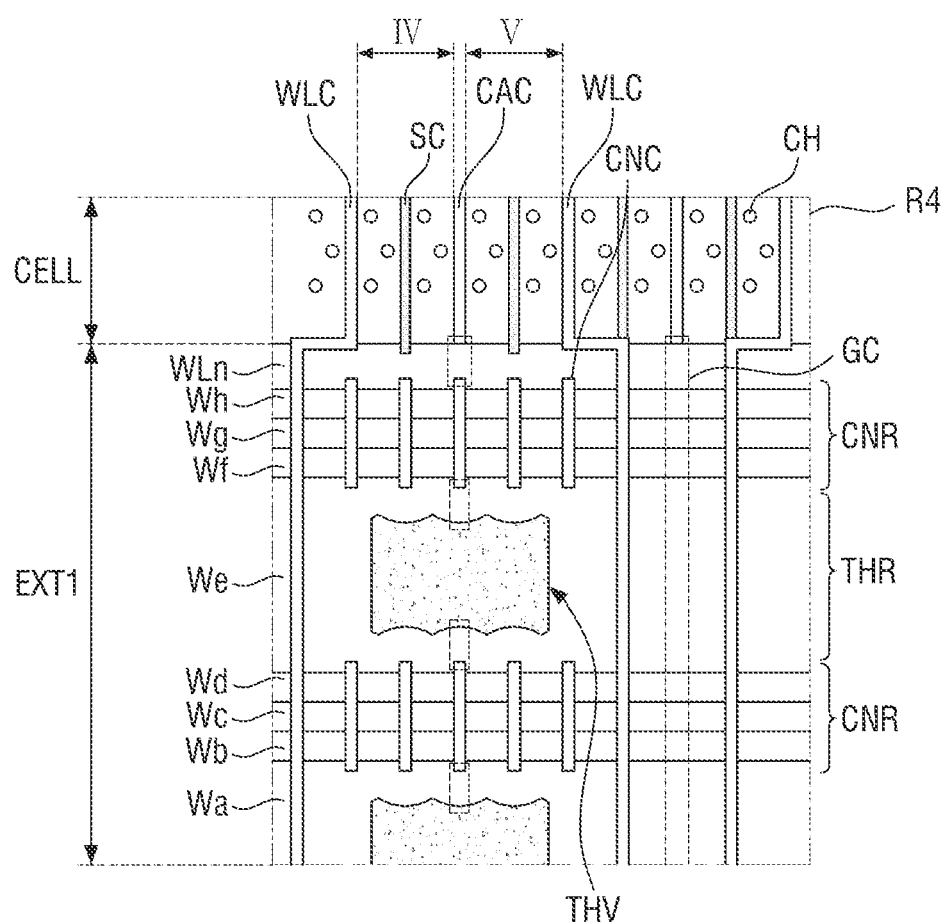

FIG. 17 is a layout view of a semiconductor memory device according to an example embodiment. FIGS. 18A through 18C are layout views illustrating a region R4 of FIG. 17. For convenience, descriptions of the elements or features that have already been described above with reference to FIGS. 1 through 16 may be omitted or simplified.

Referring to FIG. 17, widths of the memory cell blocks BLK1 through BLKn of a first extension region EXT1 and/or a second extension region EXT2 may be greater than widths of corresponding memory cell blocks BLK1 through BLKn of a cell array region CELL.

Here, the term "width", as used herein, denotes the width, in a first direction X, of the corresponding element. For example, a width D22 of part of the first extension region EXT1 corresponding to a memory cell block BLK2 may be greater than a width D21 of a corresponding part of the cell array region CELL.

In a case where the width of the parts of the first extension region EXT1 and/or the second extension region EXT2 is greater than the width of the corresponding parts of the cell array region CELL, larger contact regions CNR and/or larger through regions THR than the first extension region EXT1 and/or the second extension region EXT2 may be formed. For example, regions where through structures THV are formed may be larger in the semiconductor memory device of FIG. 17 than in the semiconductor memory device of FIG. 16.

Referring to FIGS. 17 through 18C, cell gate cutting regions CAC, extension gate cutting regions CNC, through structures THV, and lower cutting regions GC may be arranged in various manners between each pair of adjacent block isolation regions WLC.

For example, one cell gate cutting region CAC may be formed between each pair of adjacent block isolation regions WLC. Accordingly, two sections (e.g., fourth and fifth sections IV and V) may be formed between each pair of adjacent block isolation regions WLC.

In an example embodiment, the cutting structures SC may be interposed between the block isolation regions WLC and the cell gate cutting regions CAC. For example, the cutting structures SC may be interposed between the block isolation regions WLC that define fourth sections IV and fifth sections V, and the cell gate cutting regions CAC. Accordingly, the fourth sections IV may be electrically isolated from their respective fifth sections V, and as a result, two separately controllable string selection lines SSL may be provided.

The lower cutting regions GC may be connected to the cell gate cutting regions CAC, the extension gate cutting regions CNC, or the through structures THV and may thus cut ground selection lines GSL. For example, referring to FIG. 18A, two ground selection lines GSL that are cut by the cell gate cutting regions CAC, the extension gate cutting regions CNC, the through structures THV, and the lower cutting regions GC may be formed between each pair of adjacent block isolation regions WLC. Accordingly, the fourth sections IV may be electrically isolated from their respective fifth sections V, and as a result, two separately controllable ground selection lines GSL may be provided.

In an example embodiment, parts of the lower cutting regions GC may connect each pair of adjacent block isolation regions WLC. For example, parts of the lower cutting regions GC may extend in the first direction X in regions (e.g., at the boundary between the cell array region CELL and the first extension region EXT1) where each pair of adjacent block isolation regions WLC become closer to each other.

Referring to FIGS. 17 and 18B, the size of through structures THV may be increased, as compared to the size of the through structures THV of FIG. 18A. For example, the size of regions where extension gate cutting regions CNC are formed may be decreased. In this example, the amount by which second insulating patterns 115 are etched during a process of forming a plurality of gate electrodes (GSL, WL1 through WLn, and SSL) (e.g., during a replacement process) may be decreased. For example, the trough structures THV may extend further in a second direction Y.

In an example embodiment, two ground selection lines GSL that are cut by cell gate cutting regions CAC, the through structures THV, and lower cutting regions GC may be formed.

Referring to FIGS. 17 and 18C, in a first extension region EXT1, parts of lower cutting regions GC may extend longer in a second direction Y than the corresponding parts of the lower cutting regions GC of FIG. 18A. For example, through structures THV may not be formed between each pair of adjacent block isolation regions WLC. In this example, parts of the lower cutting regions GC may extend long in the second direction Y, and as a result, two ground selection lines GSL may be provided between each pair of adjacent block isolation regions WLC.

Figure 19:
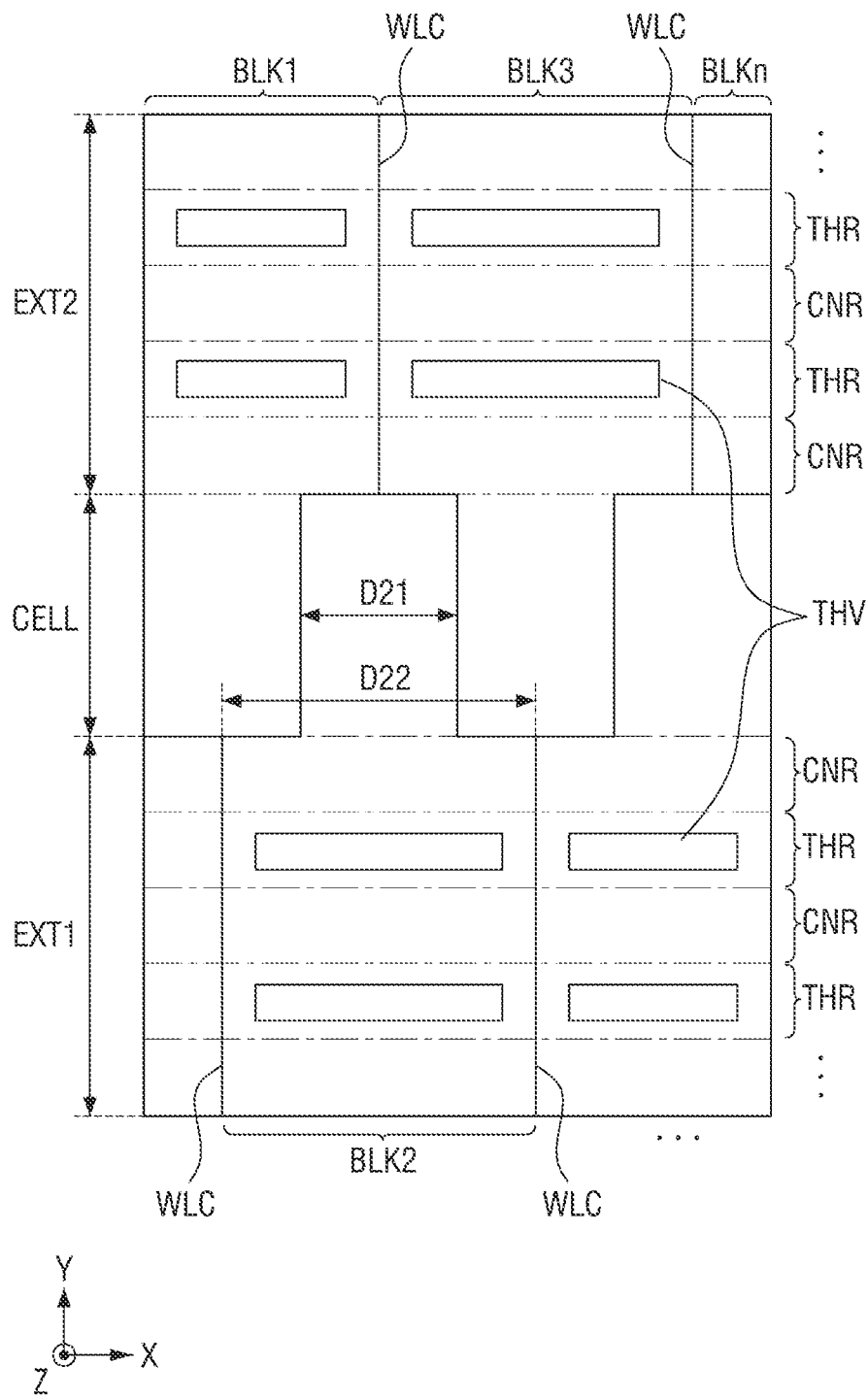
FIG. 19 is a layout view of a semiconductor memory device according to an example embodiment.

FIG. 19 is a layout view of a semiconductor memory device according to an example embodiment. For convenience, descriptions of the elements or features that have already been described above with reference to FIGS. 1 through 18C may be omitted or simplified.

Referring to FIG. 19, each of a plurality of memory cell blocks BLK1 through BLKn may not be formed in one of first and second extension regions EXT1 and EXT2.

For example, the memory cell block BLK1 may be formed in a cell array region CELL and the second extension region EXT2, but may not extend to the first extension region EXT1. Also, for example, the memory cell block BLK2 may be formed in the cell array region CELL and the first extension region EXT1, but may not extend to the second extension region EXT2.

In an example embodiment, unlike in the embodiment of FIG. 17, only one block cutting region WLC may be formed between the memory cell blocks BLK1 and BLK3.

Figure 20:
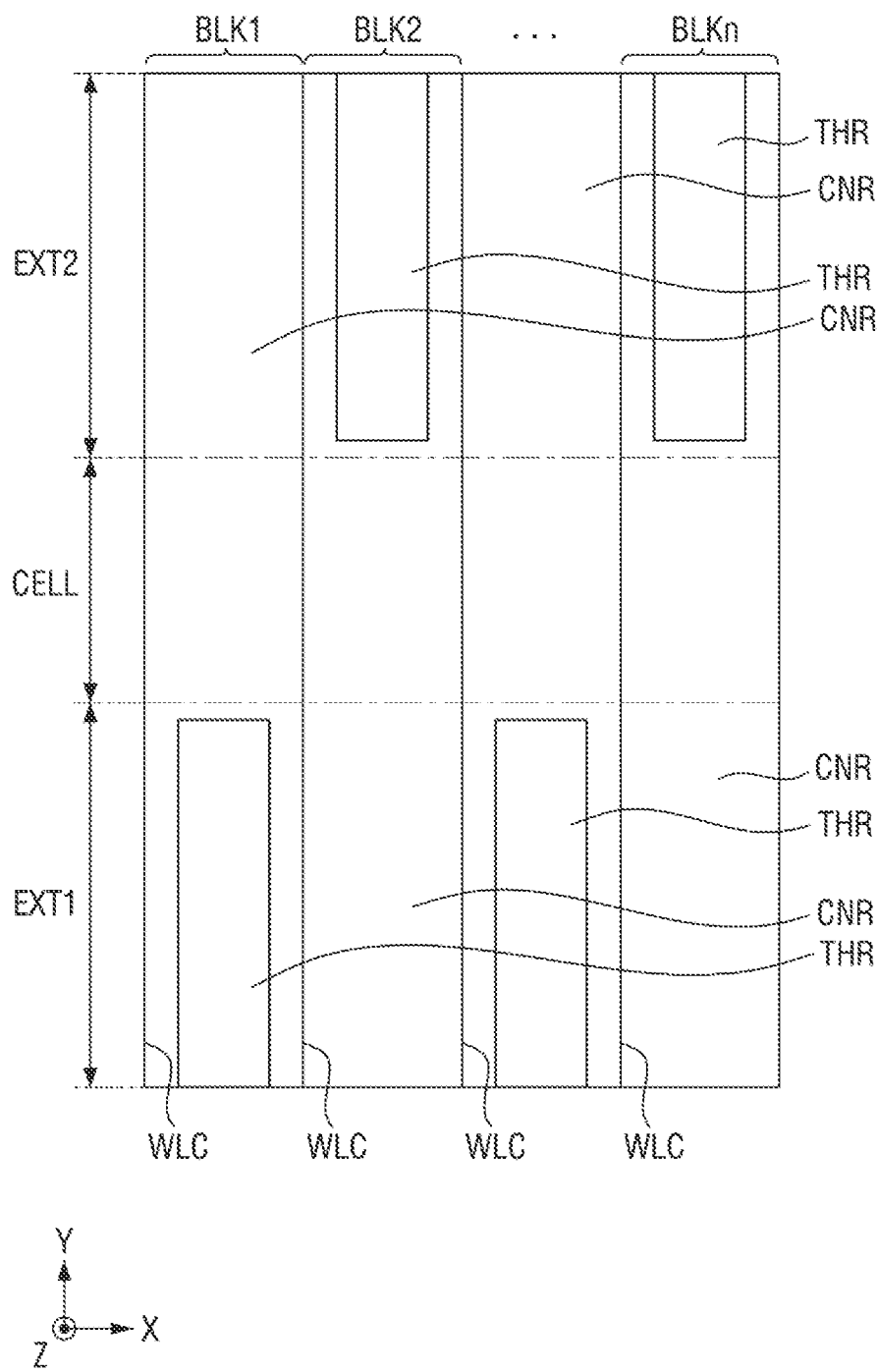
FIG. 20 is a layout view of a semiconductor memory device according to an example embodiment.

FIG. 20 is a layout view of a semiconductor memory device according to an example embodiment. For convenience, descriptions of the elements or features that have already been described above with reference to FIGS. 1 through 7 may be omitted or simplified.

Referring to FIG. 20, contact regions CNR and through regions THR may be alternately arranged along a first direction X.

For example, in a first extension region EXT1, the contact regions CNR and the through regions THR may be alternately arranged along the first direction X. Also, for example, in a second extension region EXT2, the contact regions CNR and the through regions THR may be alternately arranged along the first direction X.

FIG. 20 illustrates an example in which only one through region is formed in each of a plurality of memory cell blocks BLK1 through BLKn. Alternatively, a plurality of through regions THR and a plurality of contact regions may be formed in each of the memory cell blocks BLK1 through BLKn to be alternately arranged along a second direction Y.

A method of fabricating a semiconductor memory device according to an example embodiment will hereinafter be described with reference to FIGS. 1 through 29.

FIGS. 21 through 29 illustrate stages in a method of fabricating a semiconductor memory device according to an example embodiment. For convenience, descriptions of the elements or features that have already been described above with reference to FIGS. 1 through 20 may be omitted or simplified.

Figure 21:
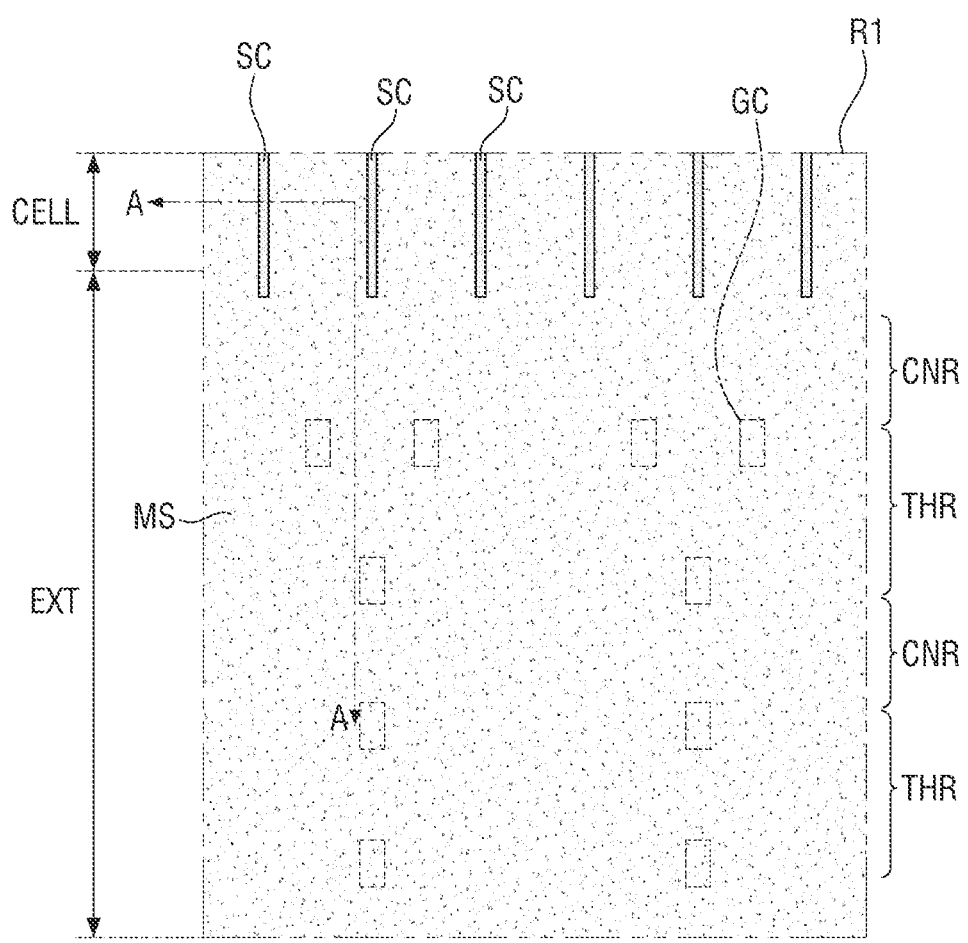
FIGS. 21 through 29 illustrate stages in a method of fabricating a semiconductor memory device according to an example embodiment.
Figure 22:
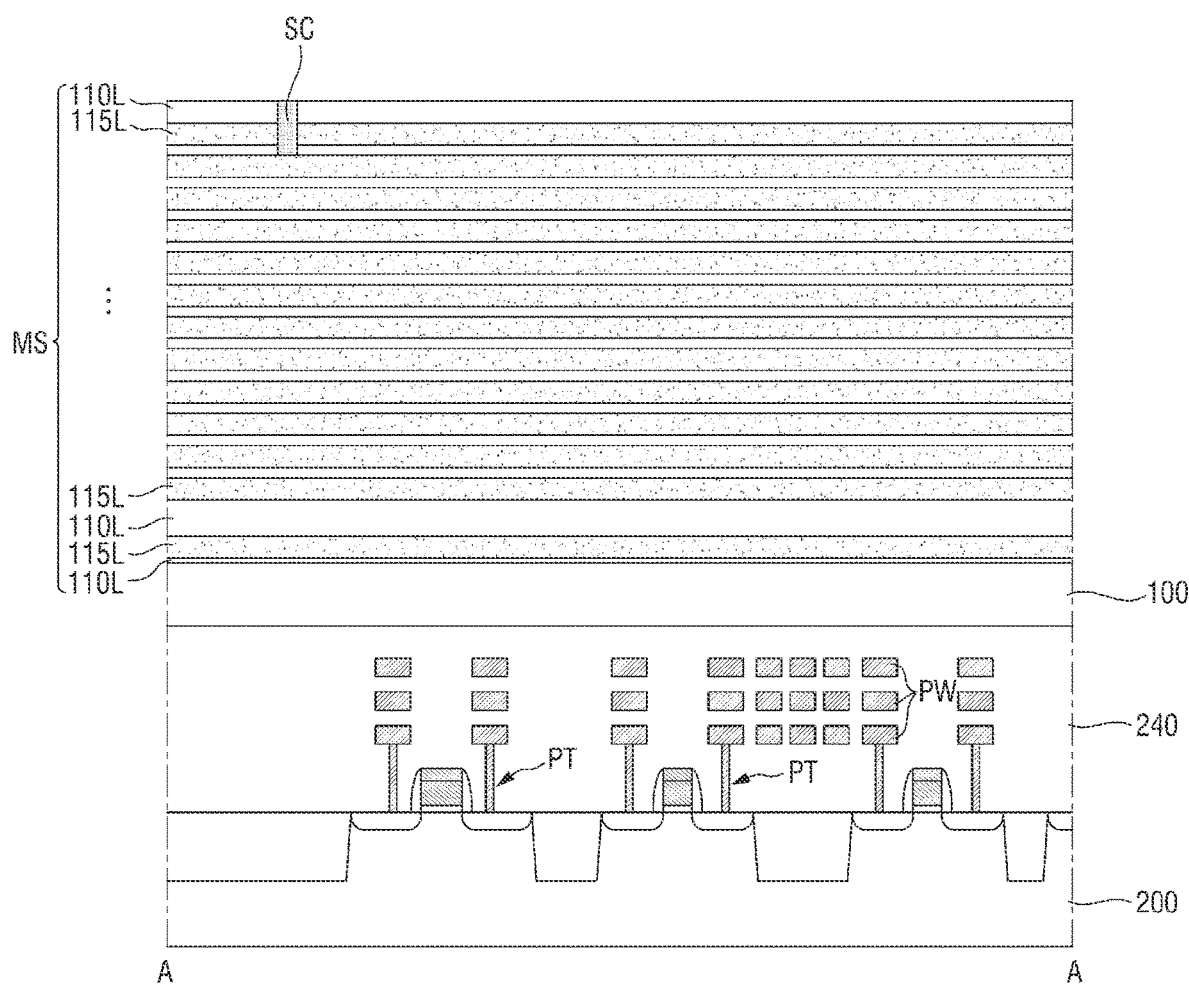

Referring to FIGS. 21 and 22, a mold structure MS is formed on a first substrate 100. FIG. 22 is a cross-sectional view taken along line A-A of FIG. 21.

The mold structure MS may be formed on the first substrate 100. The mold structure MS may include first insulating films 110L and second insulating films 115L, which are alternately stacked on the first substrate 100.

In an example embodiment, cutting structures SC may be formed in the mold structure MS in a cell array region CELL. For example, a plurality of cutting structures SC may be arranged along a first direction X in the cell array region CELL. The cutting structures SC may be arranged in a second direction Y to cut the uppermost one of the second insulating films 115L.

Figure 23:
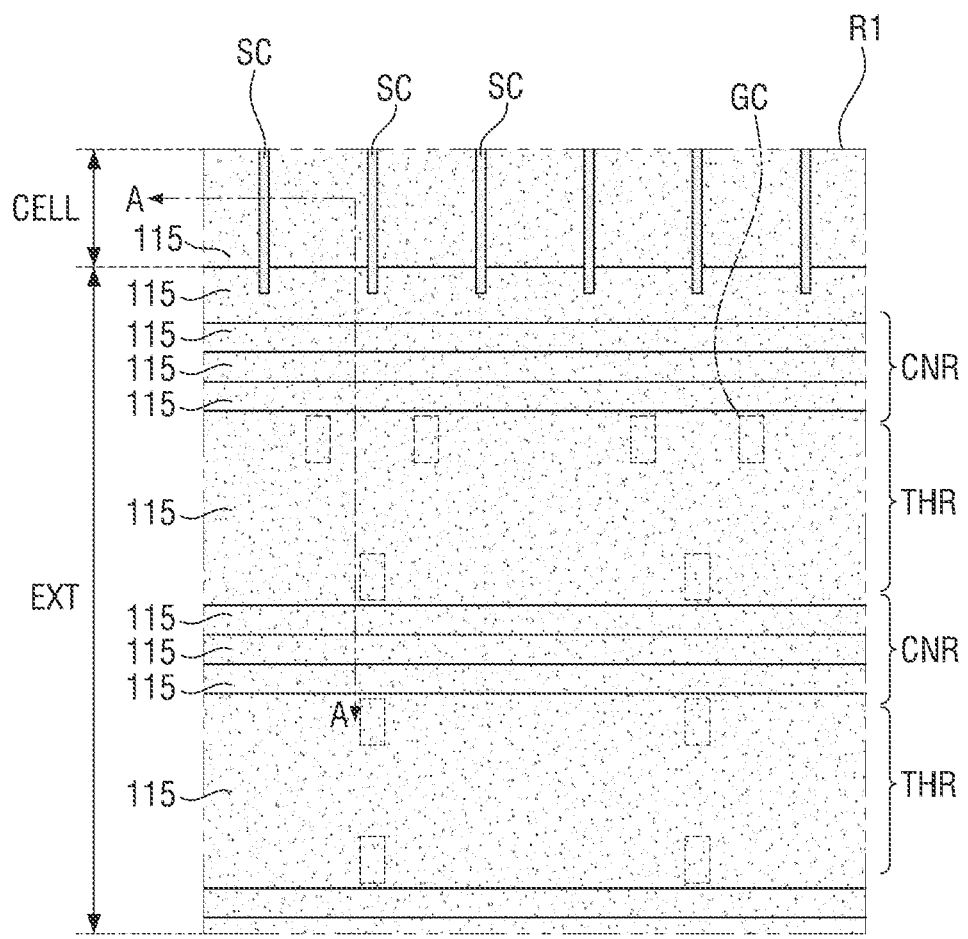
Figure 24:
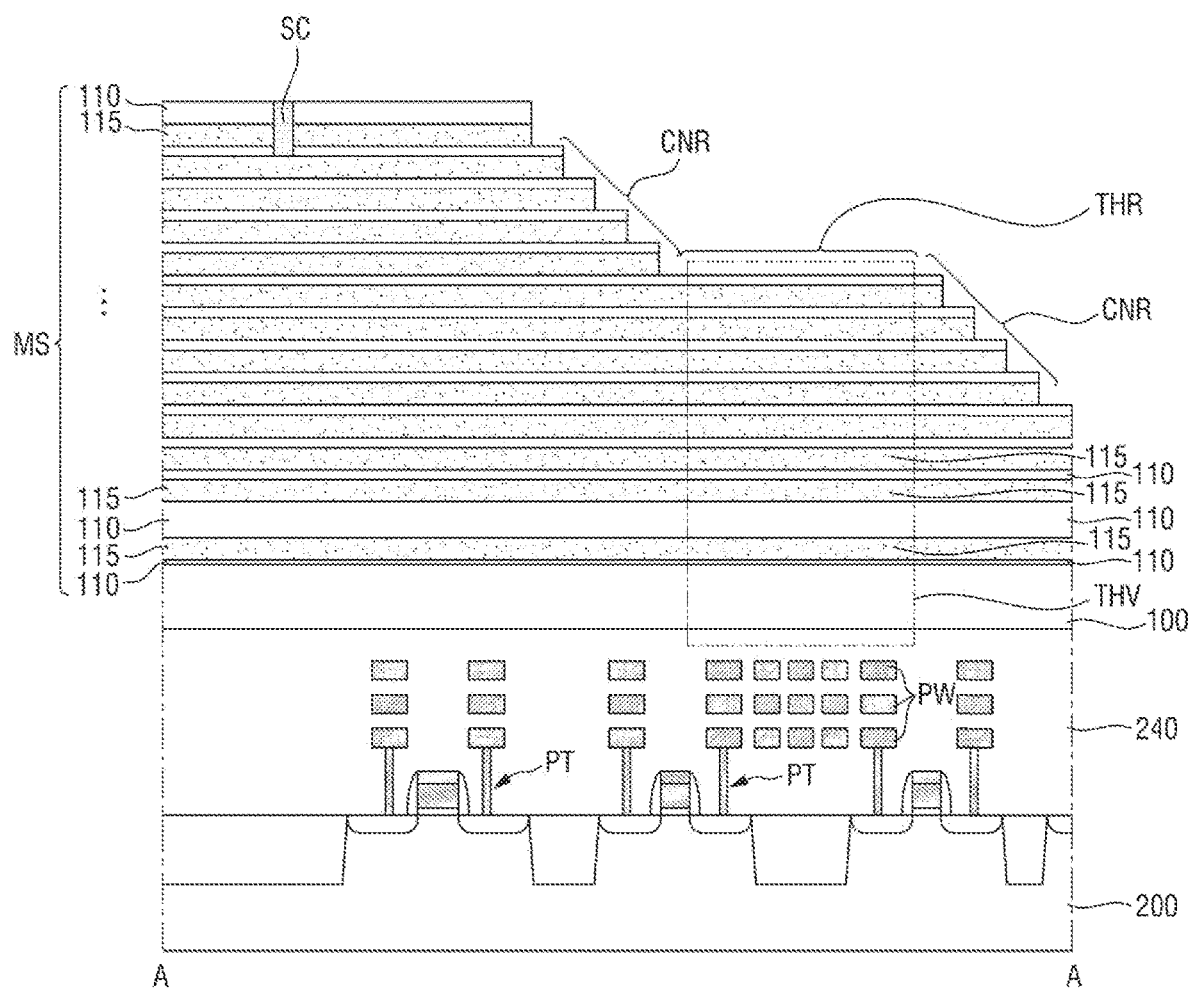

Referring to FIGS. 23 and 24, the mold structure MS may be patterned into a stepwise fashion in an extension region EXT. FIG. 24 is a cross-sectional view taken along line A-A of FIG. 23.

The first insulating films 110L may be patterned into first insulating patterns 110, which form a stepwise structure together in the second direction Y. Also, the second insulating films 115L may be patterned into second insulating patterns 115, which form a stepwise structure together in the second direction Y.

The extension region EXT may include contact regions CNR and through regions THR. The contact regions CNR and the through regions THR may be alternately arranged along the second direction Y. In an example embodiment, the length by which the second insulating patterns 115 protrude in the through regions THR may be greater than the length by which the second insulating patterns 115 protrude in the contact regions CNR.

Figure 25:
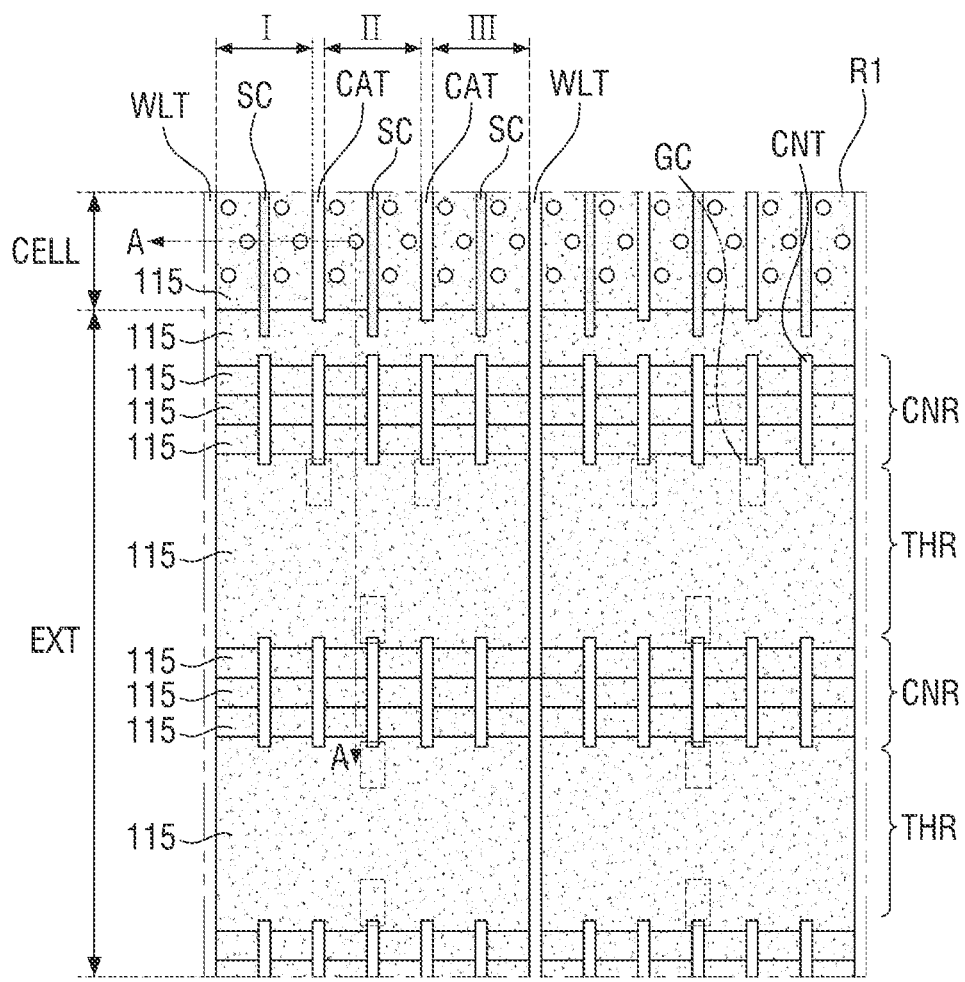
Figure 26:
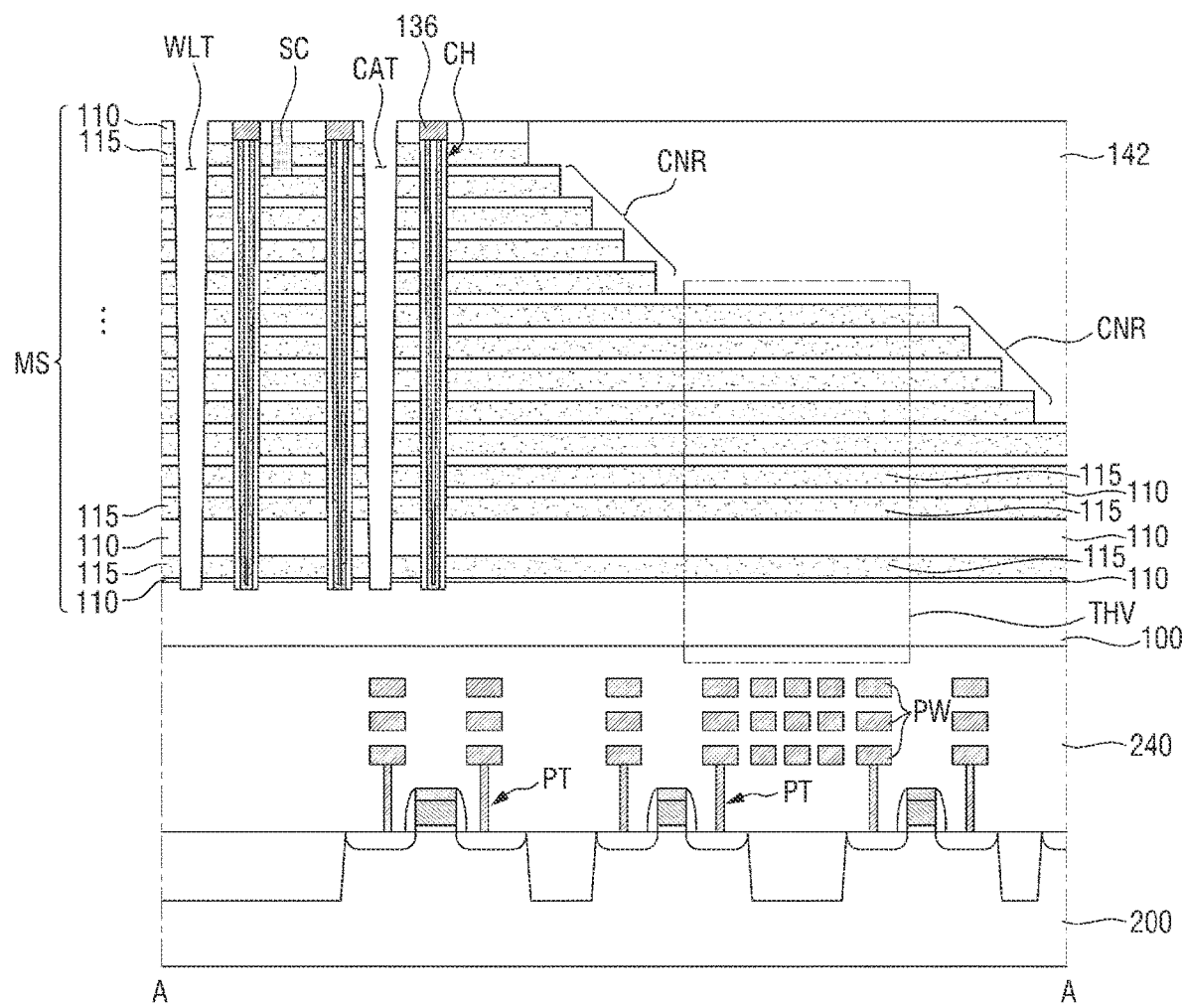
Figure 27:
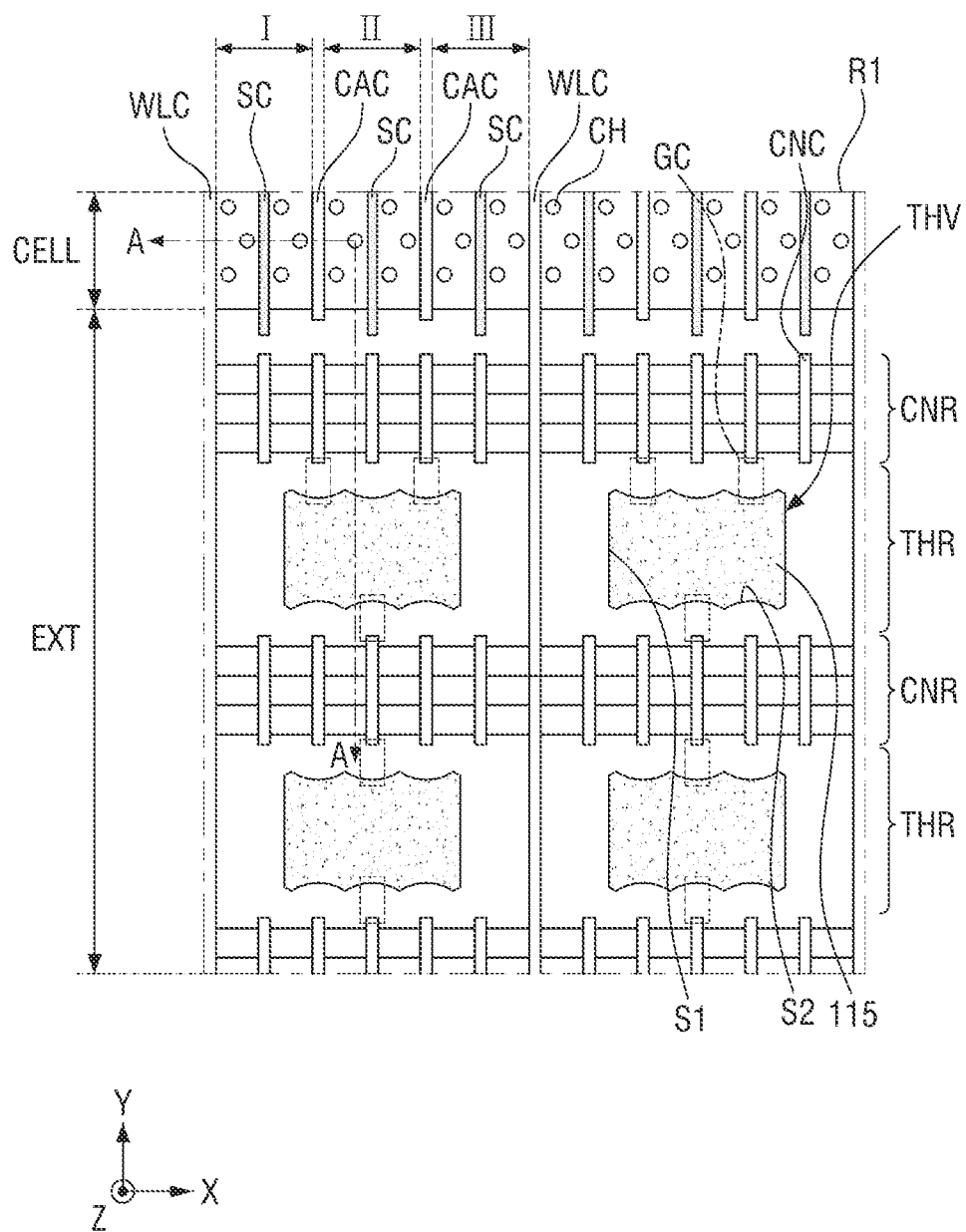

Referring to FIGS. 25 and 26, channel structures CH, block isolation trenches WLT, cell gate cutting trenches CAT, and extended gate cutting trenches CNT are formed in the mold structure MS. FIG. 26 is a cross-sectional view taken along line A-A of FIG. 25.

The channel structures CH may penetrate the mold structure MS. The channel structures CH may extend in a direction that intersects the first insulating patterns 110 and the second insulating patterns 115. For example, the channel structures CH may be in a pillar shape (e.g., a cylindrical shape) that extends in a third direction Z.

The block isolation trenches WLT may be formed in the cell array region CELL and the extension region EXT to cut a plurality of gate electrodes (GSL, WL1 through WLn, and SSL). The cell gate trenches CAT may be formed in the cell array region CELL to cut the gate electrodes (GSL, WL1 through WLn, and SSL). The extended gate cutting trenches CNT may be formed in the extension region EXT to cut the gate electrodes (GSL, WL1 through WLn, and SSL).

Figure 28:
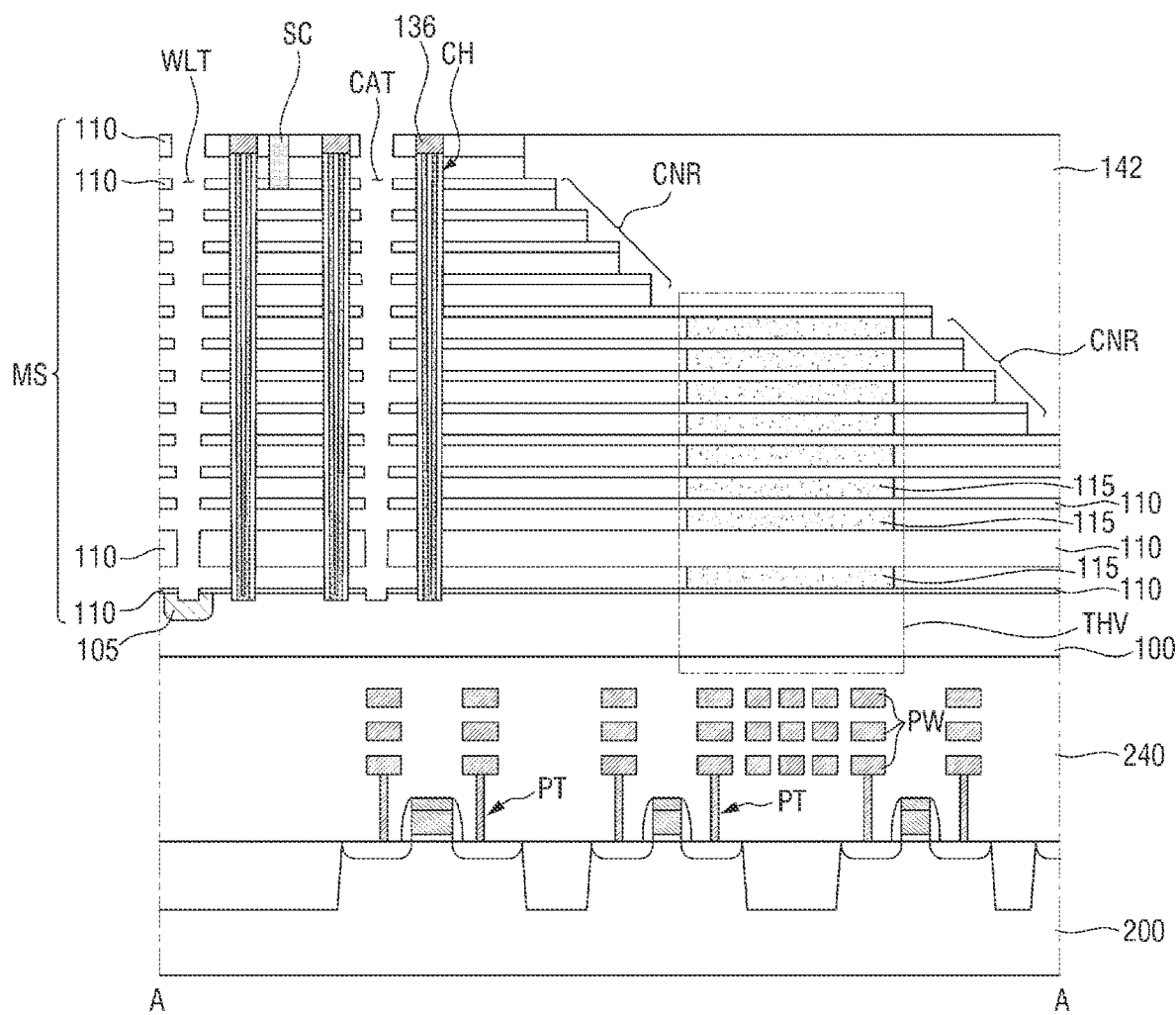
Figure 29:
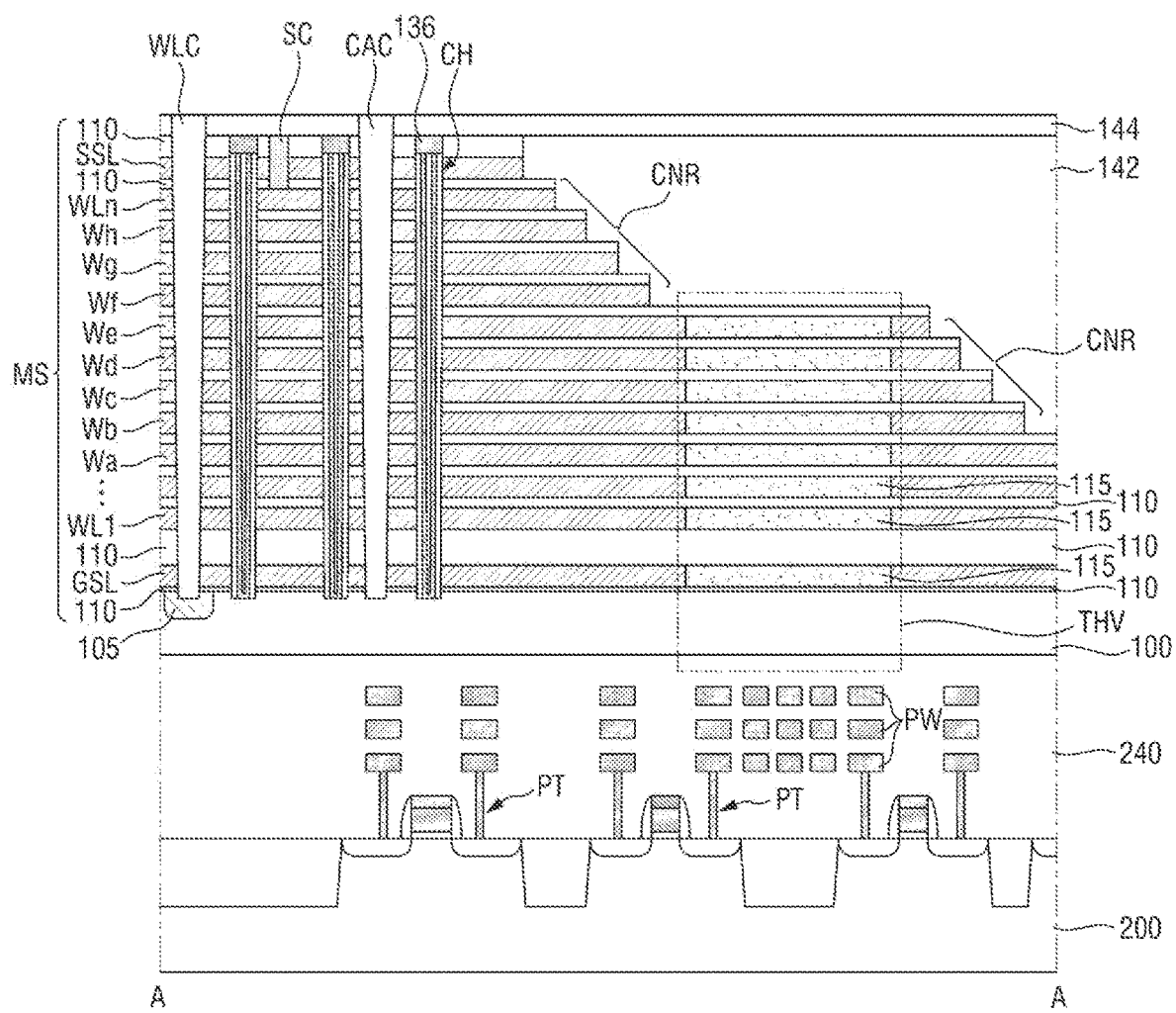

Referring to FIGS. 28 and 29, the second insulating patterns 115 may be at least partially removed using the block isolation trenches WLT, the cell gate cutting trenches CAT, and the extended gate cutting trenches CNT. FIG. 29 is a cross-sectional view taken along line A-A of FIG. 28.

For example, a pull-back process may be performed to at least partially remove the second insulating patterns 115 using the block isolation trenches WLT, the cell gate cutting trenches CAT, and the extended gate cutting trenches CNT. As a result, parts of the second insulating patterns 115 may remain so that through structures THV may be formed in the through regions THR. The through structures THV may include a plurality of first insulating patterns 110 and a plurality of second insulating patterns 115, which are alternately stacked.

Thereafter, block isolation regions WLC, cell gate cutting regions CAC, and extension gate cutting regions CNC may be formed to fill the block isolation trenches WLT, the cell gate cutting trenches CAT, and the extended gate cutting trenches CNCT, respectively.

Thereafter, referring to FIGS. 4 and 5, gate contacts 152, first through vias 154, bitlines BL, and connecting wires 156 may be formed. In this manner, a method of fabricating a semiconductor memory device with an improved integration density and reliability may be provided.

As described above, embodiments relate to a semiconductor memory device including a stepwise extension region and a method of fabricating the semiconductor memory device.

Embodiments may provide a semiconductor memory device with an improved integration density and reliability. Embodiments may provide a method of fabricating a semiconductor memory device with an improved integration density and reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a semiconductor memory device, comprising:
providing a substrate including a cell array region and an extension region, which are arranged along a first direction, the extension region including contact regions and through regions, which are alternately arranged along the first direction;
forming a mold structure including first insulating patterns and second insulating patterns, which are alternately stacked on the substrate;

forming a channel structure through the mold structure of the cell array region to intersect the first insulating patterns and the second insulating patterns;

forming an extension gate cutting region extending in the first direction to cut the mold structure, in the mold structure of the contact regions; and selectively removing the second insulating patterns in the contact regions, using the extension gate cutting region, so that the second insulating patterns in the through regions remain.

2. The method of claim 1, further comprising:

after the selectively removing the second insulating patterns in the contact regions, forming gate electrodes in regions from which the second insulating patterns are removed.

3. The method of claim 1, wherein the forming the mold structure including the first insulating patterns and the second insulating patterns includes:

forming first insulating films and second insulating films, which are alternately stacked on the substrate; and patterning the first insulating films and the second insulating films in the extension region in a stepwise fashion.

4. The method of claim 1, further comprising:

forming a cell gate cutting region extending in the first direction to cut the mold structure, in the mold structure of the cell array region.

5. The method of claim 4, wherein the forming the cell gate cutting region and the forming the extension gate cutting region are performed at the same time.

6. A method of fabricating a semiconductor memory device, comprising:

providing a substrate including a cell array region and an extension region, which are arranged along a first direction, the extension region including contact regions and through regions, which are alternately arranged along the first direction;

forming a mold structure including first insulating patterns and second insulating patterns, which are stacked on the substrate;

forming a channel structure through the mold structure of the cell array region to intersect the first insulating patterns and the second insulating patterns;

forming an extension gate cutting region extending in the first direction to cut the mold structure, in the mold structure of the contact regions; and forming a cell gate cutting trench by removing a portion of first insulating patterns and second insulating patterns, in the mold structure of the cell array region, forming gate electrodes by filling the cell gate cutting trench with a semiconductor material.

7. The method of claim 6, wherein forming the mold structure including the first insulating patterns and the second insulating patterns includes:

forming first insulating films and second insulating films, which are alternately stacked on the substrate; and patterning the first insulating films and the second insulating films in the extension region in a stepwise fashion along the first direction.

8. The method of claim 7, wherein patterning the first insulating films and the second insulating films includes:

forming exposed gate electrodes such that the exposed gate electrodes in the through region is longer than the exposed gate electrode in the contact regions.

9. The method of claim 6, further comprising:

forming a plurality of through via in the through regions to penetrate first insulating patterns and second insulating patterns.

10. The method of claim 6, further comprising:

forming gate contacts which are connected to gate electrodes, on the mold structure of contact regions.

11. The method of claim 10, further comprising:

forming interlayer insulating films covering an upper surface of the mold structure of the extension region such that interlayer insulating films are penetrated by respective gate contacts.

12. The method of claim 6, wherein forming the channel structure includes:

forming semiconductor patterns through the mold structure to connect with the substrate; and forming information storage films to be interposed between semiconductor patterns and gate electrodes.

13. The method of claim 6, further comprising:

forming a bitline extending in a second direction, which intersects the first direction, on the mold structure to be connected to the channel structure.

* * * * *